(12) United States Patent
Lu et al.

(10) Patent No.: US 9,728,551 B1
(45) Date of Patent: Aug. 8, 2017

(54) MULTI-TIER REPLACEMENT MEMORY STACK STRUCTURE INTEGRATION SCHEME

(71) Applicant: SANDISK TECHNOLOGIES INC., Plano, TX (US)

(72) Inventors: Ching-Huang Lu, San Jose, CA (US); Zhenyu Lu, Milpitas, CA (US); Jixin Yu, Milpitas, CA (US); Daxin Mao, Cupertino, CA (US); Johann Alsmeier, San Jose, CA (US); Wenguang Stephen Shi, Milpitas, CA (US); Henry Chien, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/015,190

(22) Filed: Feb. 4, 2016

(51) Int. Cl.
*H01L 29/74* (2006.01)
*H01L 29/80* (2006.01)
(Continued)

(52) U.S. Cl.
CPC .... *H01L 27/11582* (2013.01); *H01L 21/0217* (2013.01); *H01L 21/02164* (2013.01); *H01L 21/02236* (2013.01); *H01L 21/2251* (2013.01); *H01L 21/28273* (2013.01); *H01L 21/28282* (2013.01); *H01L 21/3003* (2013.01); *H01L 23/528* (2013.01); *H01L 23/5226* (2013.01); *H01L 27/1157* (2013.01); *H01L 27/11519* (2013.01); *H01L 27/11524* (2013.01);
(Continued)

(58) Field of Classification Search
CPC ......... H01L 27/11521; H01L 27/11524; H01L 27/11568; H01L 27/1157; H01L 29/7926; H01L 29/7889; H01L 29/66666
See application file for complete search history.

(56) References Cited

U.S. PATENT DOCUMENTS 5,915,167 A 6/1999 Leedy
6,274,490 B1 8/2001 Chyan et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Hsien Ming Lee
(74) *Attorney, Agent, or Firm* — The Marbury Law Group PLLC

(57) ABSTRACT

A memory opening can be formed through a multiple tier structure. Each tier structure includes an alternating stack of sacrificial material layers and insulating layers. After formation of a dielectric oxide layer, the memory opening is filled with a sacrificial memory opening fill structure. The sacrificial material layers are removed selective to the insulating layers and the dielectric oxide layer to form backside recesses. Physically exposed portions of the dielectric oxide layer are removed. A backside blocking dielectric and electrically conductive layers are formed in the backside recesses. Subsequently, the sacrificial memory opening fill structure is replaced with a memory stack structure including a plurality of charge storage regions and a semiconductor channel. Hydrogen or deuterium from a dielectric core may then be outdiffused into the semiconductor channel.

36 Claims, 23 Drawing Sheets

(51) Int. Cl.
H01L 29/792 (2006.01)
H01L 21/00 (2006.01)
H01L 21/336 (2006.01)
H01L 27/11582 (2017.01)
H01L 27/11556 (2017.01)
H01L 27/11519 (2017.01)
H01L 27/11565 (2017.01)
H01L 23/528 (2006.01)
H01L 23/522 (2006.01)
H01L 29/788 (2006.01)
H01L 29/04 (2006.01)
H01L 21/28 (2006.01)
H01L 21/225 (2006.01)
H01L 21/30 (2006.01)
H01L 21/02 (2006.01)
H01L 27/11524 (2017.01)
H01L 27/1157 (2017.01)

(52) U.S. Cl.
CPC .. *H01L 27/11556* (2013.01); *H01L 27/11565* (2013.01); *H01L 29/04* (2013.01); *H01L 29/7883* (2013.01)

(56) References Cited

U.S. PATENT DOCUMENTS

| | | | |
|---|---|---|---|
| 6,372,569 | B1 | 4/2002 | Lee et al. |
| 6,677,213 | B1 | 1/2004 | Ramkumar et al. |
| 6,833,306 | B2 | 12/2004 | Lyding et al. |
| 8,884,357 | B2 | 11/2014 | Wang et al. |
| 8,946,023 | B2 | 2/2015 | Makala et al. |
| 9,230,979 | B1 * | 1/2016 | Pachamuthu ..... H01L 27/11575 |
| 9,230,987 | B2 | 1/2016 | Pachamuthu et al. |
| 2009/0321855 | A1 | 12/2009 | Ashutosh et al. |
| 2011/0045657 | A1 | 2/2011 | Kim et al. |
| 2011/0287612 | A1 | 11/2011 | Lee et al. |
| 2012/0273894 | A1 | 11/2012 | Chen et al. |
| 2013/0089974 | A1 | 4/2013 | Lee et al. |
| 2014/0225181 | A1 | 8/2014 | Makala et al. |
| 2014/0264525 | A1 | 9/2014 | Takahashi et al. |
| 2015/0194435 | A1 * | 7/2015 | Lee ................... H01L 27/11575 257/329 |
| 2016/0118391 | A1 | 4/2016 | Zhao et al. |

OTHER PUBLICATIONS

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

International Search Report and Written Opinion of International Searching Authority for PCT/US2015/051484, filed Sep. 22, 2015, dated Dec. 1, 2015, 13 pages.

Bu, J. et al., "Design Considerations in Scaled SONOS Nonvolatile Memory Devices," Solid State Electronics, Elsevier Science Publishers, vol. 45, No. 1, pp. 113-120, XP004313662, (2001).

Yelundur, et al., "Beneficial Impact of Low Frequency PECVD SiN X:H-Induced Hydrogenation in High-Efficiency String Ribbon Silicon Solar Cells," Nineteenth European Photovoltaic Solar Energy Conference: Proceedings of the International Conference Held in Paris, France, 4 sheets, (2004).

U.S. Appl. No. 14/133,979, filed Dec. 19, 2013, SanDisk Technologies LLC.

U.S. Appl. No. 14/225,116, filed Mar. 25, 2014, SanDisk Technologies LLC.

U.S. Appl. No. 14/225,176, filed Mar. 25, 2014, SanDisk Technologies LLC.

U.S. Appl. No. 14/834,830, filed Aug. 25, 2015, SanDisk Technologies LLC.

U.S. Appl. No. 14/834,943, filed Aug. 25, 2015, SanDisk Technologies LLC.

U.S. Appl. No. 14/862,916, filed Sep. 23, 2015, SanDisk Technologies LLC.

U.S. Appl. No. 14/883,966, filed Oct. 15, 2015, SanDisk Technologies LLC.

U.S. Appl. No. 15/080,269, filed Mar. 24, 2016, SanDisk Technologies LLC.

* cited by examiner

MULTI-TIER REPLACEMENT MEMORY STACK STRUCTURE INTEGRATION SCHEME

FIELD

The present disclosure relates generally to the field of three-dimensional memory devices and specifically to three-dimensional memory devices including a vertical stack of multilevel memory arrays and methods of making the same.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises at least one tier structure located over a top surface of a substrate, the at least one tier structure comprising an alternating stack including insulating layers and electrically conductive layers, a memory opening extending through an entirety of the at least one tier structure, a memory stack structure located within the memory opening and comprising a plurality of charge storage regions and a vertical portion of a semiconductor channel, a first active region located in the substrate, a second active region located in an upper portion of the memory opening, and a backside contact via structure extending through the at least one tier structure, wherein a top surface of the backside contact via structure and a top surface of the second active region are within a same horizontal plane that is parallel to the top surface of the substrate.

According to another aspect of the present disclosure, a monolithic three-dimensional memory device is provided, which comprises: at least one tier structure located on a top surface of a substrate, each of the at least one tier structure comprising an alternating stack including insulating layers and electrically conductive layers; a memory opening extending through an entirety of the at least one tier structure; a memory stack structure located within the memory opening and comprising a plurality of charge storage regions; a first active region located in the substrate; a second active region located in an upper portion of the memory opening; a semiconductor channel extending from the first active region, through the memory opening, and to the second active region; and a dielectric core containing hydrogen isotopes, wherein the hydrogen isotopes have a greater average atomic concentration within the dielectric core than within a vertical portion of the semiconductor channel in the memory opening.

According to yet another aspect of the present disclosure, a method of forming a three-dimensional memory device is provided, which comprises forming a lower tier structure over a substrate, the lower structure comprising an alternating stack of insulating layers and sacrificial material layers, forming a first memory opening extending through the lower tier structure, forming an upper tier structure over the lower tier structure, the upper tier structure comprising an alternating stack of insulating layers and sacrificial material layers, forming a second memory opening through the upper tier structure in an area overlying the first memory opening, forming a memory opening fill structure within the first and the second memory openings, replacing the sacrificial material layers of the upper and lower tier structure with electrically conductive layers, and replacing, after formation of the electrically conductive layers, the sacrificial memory opening fill structure with a memory stack structure that includes a plurality of charge storage regions located at levels of the electrically conductive layers and a vertical portion of a semiconductor channel.

According to yet another aspect of the present disclosure, a method of forming a three-dimensional memory device is provided, which comprises forming at least one tier structure over a substrate, the at least one tier structure comprising an alternating stack of insulating layers and sacrificial material layers, forming a memory opening extending through an entirety of the alternating stack, replacing the sacrificial material layers of the at least one tier structure with electrically conductive layers, forming a memory stack structure that includes a plurality of charge storage regions located at levels of the electrically conductive layers and a vertical portion of a semiconductor channel, forming a forming a dielectric core within the memory stack structure inside the memory opening, wherein the dielectric core comprises a dielectric material having an average atomic concentration of hydrogen isotopes greater than $5 \times 10^{17}/cm^3$, and outdiffusing the hydrogen isotopes from the dielectric core into the vertical portion of the semiconductor channel.

DETAILED DESCRIPTION

Figure 1:
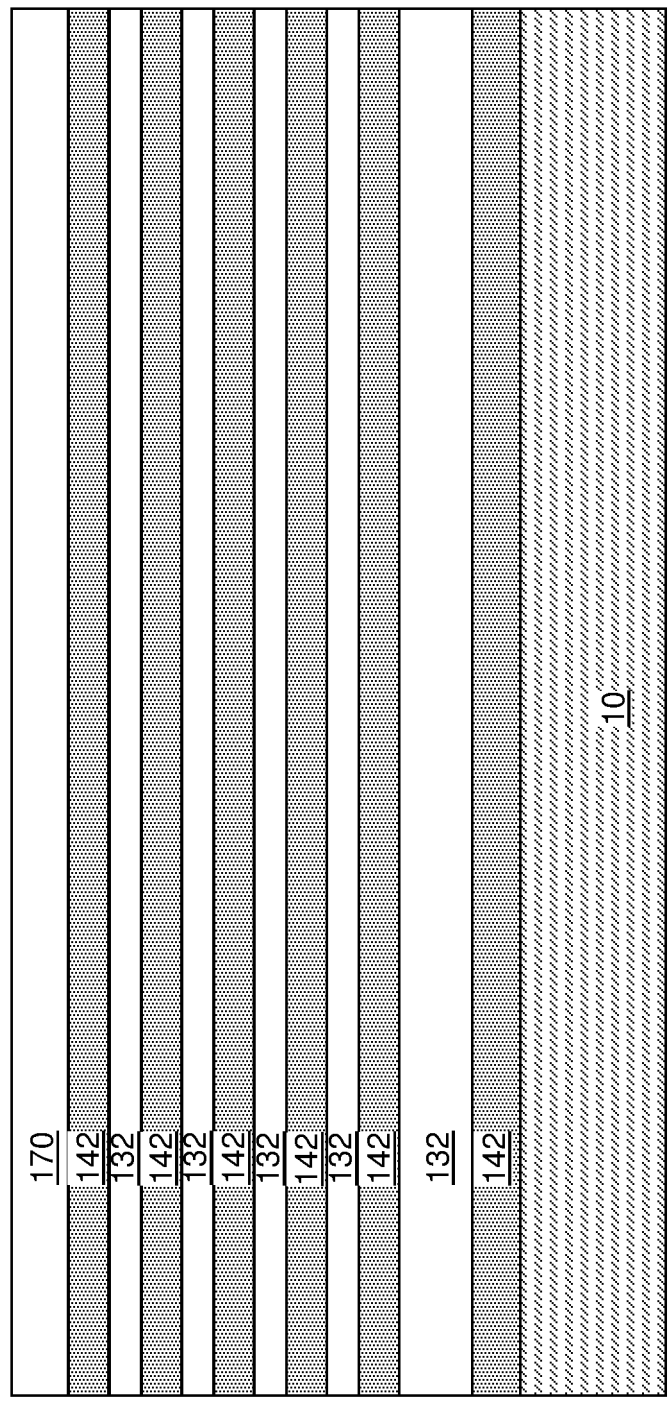
FIG. 1 is a vertical cross-sectional view of an exemplary structure after formation of a first alternating stack of first insulating layers and first sacrificial material layers according to an embodiment of the present disclosure.

The present inventors realized that a typical integration scheme for manufacturing a three-dimensional NAND string, memory cells are fabricated prior to replacement of sacrificial material layers with electrically conductive layers. In such an integration scheme, control gate corner rounding leads to short channel effects and slow program speed, blocking dielectric is not very uniform because it acts as a nitride recess stop layer, ONON shrinkage leads to memory opening inclination and a small backside trench to memory opening distance margin. This eventually causes a tungsten control gate deficit issue. In addition, when use of a hydrogen-rich or deuterium-rich memory core material is attempted, a high thermal budget in the sacrificial material layer replacement processes can significantly decrease the concentration of hydrogen or deuterium in the channel because hydrogen and/or deuterium outdiffuses from the channel, thereby making the hydrogen/deuterium passivation less efficient.

The present inventors realized that in some non-limiting embodiments, some or all of the issues above may be overcome by forming the channel after forming the metal control gate electrodes in the stack, and by doping the channel with hydrogen and/or deuterium after the final high temperature process used during fabrication of the device. For example, hydrogen or deuterium may be diffused into the channel from core dielectric after the last high temperature process step in the method of making the device.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 10. The substrate semiconductor layer 10 can be a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 10 can comprise a single crystalline semiconductor material, such as a single crystal silicon wafer.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10. While the substrate semiconductor layer 10 is alternatively referred to as the substrate 10 in the present disclosure, it is understood that the substrate 10 may optionally include additional material layers (such as a handle substrate and a buried insulator layer as in the case of a semiconductor-on-insulator substrate).

The exemplary structure includes a device region, in which memory devices can be subsequently formed, and a contact region (shown in FIG. 23 and described in more detail below), in which stepped surfaces are subsequently formed. As used herein, a "contact region" refers to a region in which contact via structures are to be formed. At least one semiconductor device for a peripheral circuitry can be formed in a peripheral device region (not shown). The at least one semiconductor device can include, for example, one or more field effect transistors. The least one semiconductor device for the peripheral circuitry can contain a driver circuit for memory devices to be subsequently formed, which can include at least one NAND device.

Optionally, a doped semiconductor well (not separately shown) can be provided in an upper portion of the substrate semiconductor layer 10. The doped semiconductor well can be formed, for example, by implantation of electrical dopants (p-type dopants or n-type dopants) into an upper portion of the substrate semiconductor layer 10, or by deposition of a single crystalline semiconductor material, for example, by selective epitaxy. In one embodiment, the doped semiconductor well can include a single crystalline semiconductor material (e.g., p-well).

An alternating stack of first material layers and second material layers is subsequently formed. Each first material layer can include a first material, and each second material layer can include a second material that is different from the first material. The alternating stack is herein referred to as a first alternating stack. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first tier structure (132, 142), or a lower tier structure (132, 142). Thus, the lower tier structure (132, 142) can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The lower tier structure (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the lower tier structure (132, 142) can have a uniform thickness that is substantially invariant within each respective first sacrificial material layer 142.

A first dielectric cap layer 170 are sequentially formed. The first dielectric cap layer 170 includes a dielectric material, which can be any dielectric material that can be employed for the first insulating layers 132. In one embodiment, the first dielectric cap layer 170 includes the same dielectric material as the first insulating layers 132. The thickness of the dielectric cap layer 170 can be in a range from 20 nm to 300 nm, although lesser and greater thicknesses can also be employed.

Optionally, the first dielectric cap layer 170 and the lower tier structure (132, 142) can be patterned to form first stepped surfaces in a contact region (shown in FIG. 23 and described in more detail below). The contact region includes a first stepped area in which the first stepped surfaces are formed, and a second stepped area in which additional stepped surfaces are to be subsequently formed in an upper tier structure (to be subsequently formed over the lower tier structure). The first stepped surfaces can be formed, for example, by forming a mask layer with an opening therein, etching a cavity within the levels of the first dielectric cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first retro-stepped dielectric material portion (not shown). As used herein, a "retro-stepped" element refers to an element that has stepped surfaces and a horizontal cross-sectional area that increases monotonically as a function of a vertical distance from a top surface of a substrate on which the element is present. The lower tier structure can comprise the first alternating stack (132, 142) and the first retro-stepped dielectric material portion.

Figure 2:
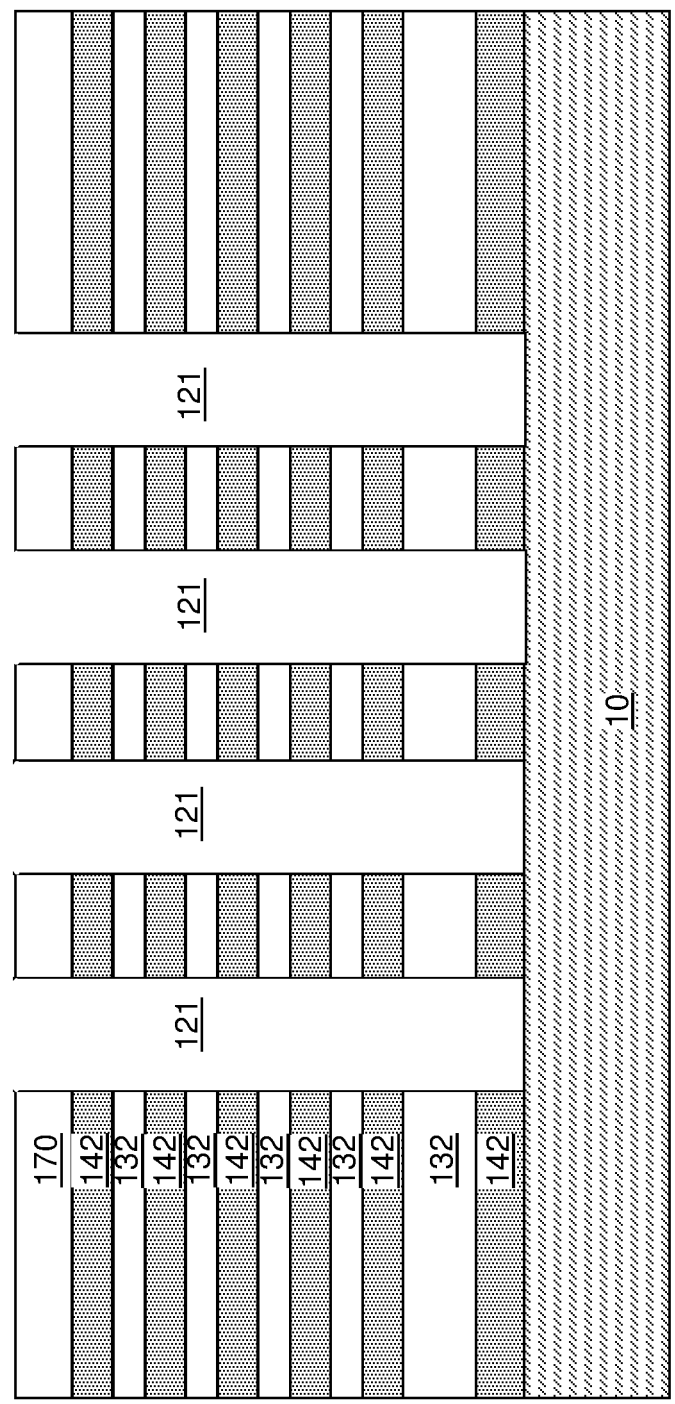
FIG. 2 is a vertical cross-sectional view of the exemplary structure after formation of first memory openings according to an embodiment of the present disclosure.

Referring to FIG. 2, first memory openings 121 extending to a top surface of the substrate 10 are formed through the lower tier structure (132, 142). The first memory openings 121 can be formed in the device region. For example, a lithographic material stack (not shown) including at least a photoresist layer can be formed over the first dielectric cap layer 170, and can be lithographically patterned to form openings within the lithographic material stack. The pattern in the lithographic material stack can be transferred through the first dielectric cap layer 170 and through the entirety of the lower tier structure (132, 142) by at least one anisotropic etch that employs the patterned lithographic material stack as an etch mask. Portions of the first dielectric cap layer 170 and the lower tier structure (132, 142) underlying the openings in the patterned lithographic material stack are etched to form the first memory openings 121. In other words, the transfer of the pattern in the patterned lithographic material stack through the first dielectric cap layer 170 and the lower tier structure (132, 142) forms the first memory openings 121.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches. The sidewalls of the first memory openings 121 can be substantially vertical, or can be tapered. Subsequently, the patterned lithographic material stack can be subsequently removed, for example, by ashing.

Figure 3:
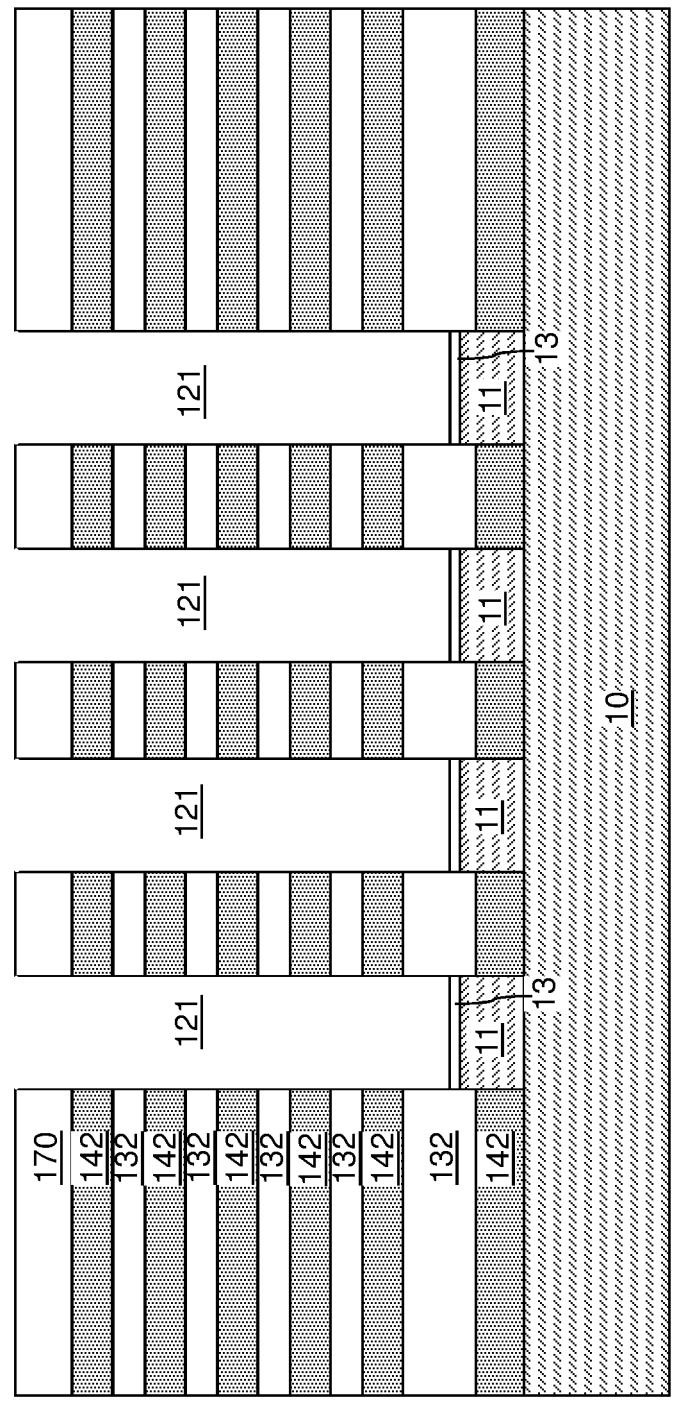
FIG. 3 is a vertical cross-sectional view of the exemplary structure after formation of epitaxial channel portions and semiconductor oxide portions according to an embodiment of the present disclosure.

Referring to FIG. 3, a selective epitaxy process can be performed to deposit a semiconductor material on physically exposed semiconductor surfaces. Specifically, epitaxial channel portions 11 grow from the semiconductor surfaces at the bottom of the first memory openings 121 during the selective epitaxy process. The epitaxial channel portions 11 comprise a single crystalline semiconductor material in epitaxial alignment with the single crystalline substrate semiconductor material of the substrate semiconductor layer 10.

In one embodiment, the deposited semiconductor material may be doped with in-situ doping of a p-type dopant or an n-type dopant. Thus, the epitaxial channel portions 11 can be doped with electrical dopants of a suitable conductivity type. In one embodiment, the substrate semiconductor layer 10 and the epitaxial channel portions 11 can have a doping of the first conductivity type (e.g., p-type). The epitaxial channel portions 11 may comprise silicon.

The selective epitaxy process can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the substrate semiconductor layer 10) is greater than the etch rate of the semiconductor material by the etchant. Thus, the semiconductor material is deposited only on the semiconductor surface, which is the physically exposed portion of the top surface of the substrate semiconductor layer 10. The process conditions (such as the deposition temperature, the partial pressure of the various gases in a process chamber, etc.) can be selected such that the deposited semiconductor material is epitaxial, i.e., single crystalline silicon or another semiconductor material with atomic alignment with the single crystalline structure of the substrate semiconductor layer 10 (e.g., p-well). Each epitaxial channel portion 11 can be formed at a bottom portion of a respective first memory opening 121.

Subsequently, a thermal oxidation process or a plasma oxidation process can be performed to oxidize a surface portion of each epitaxial channel portion 11, thereby converting the surface portion into a respective semiconductor oxide portion 13 (e.g., a silicon oxide portion when portion 11 comprises silicon). The thickness of the semiconductor oxide portion 13 can be in a range from 1 nm to 10 nm, such as 2-4 nm, although lesser and greater thicknesses can also be employed.

Figure 4:
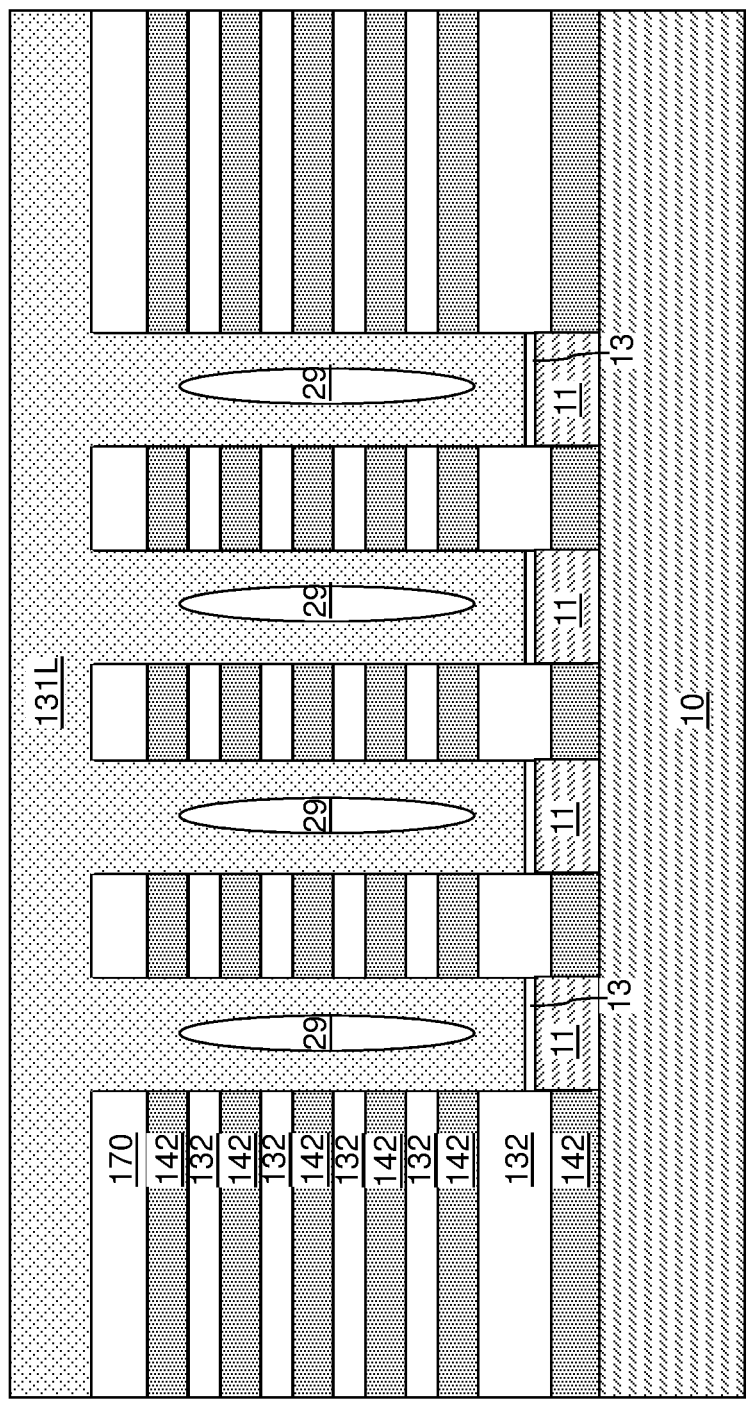
FIG. 4 is a vertical cross-sectional view of the exemplary structure after deposition of a temporary material layer according to an embodiment of the present disclosure.

Referring to FIG. 4, a temporary material layer 131 can be deposited over the epitaxial channel portions 11 in the first memory openings 121. The temporary material layer 131 includes a temporary material, i.e., a sacrificial material, that is subsequently removed selective to the materials of the first insulating layers 132 and the first sacrificial material layers 142. In one embodiment, the temporary material layer 131 includes a semiconductor material such as silicon (e.g., polysilicon), a silicon-germanium alloy, germanium, a III-V compound semiconductor material, or a combination thereof. The temporary material layer 131 may be formed by a non-conformal deposition or a conformal deposition method. In one embodiment, a cavity 29 may be formed inside one or more of the first memory openings 121 in case a non-conformal deposition method is employed to form the temporary material layer 131. In one embodiment, the temporary material layer 131 can be formed directly on the semiconductor oxide portions 13.

Figure 5:
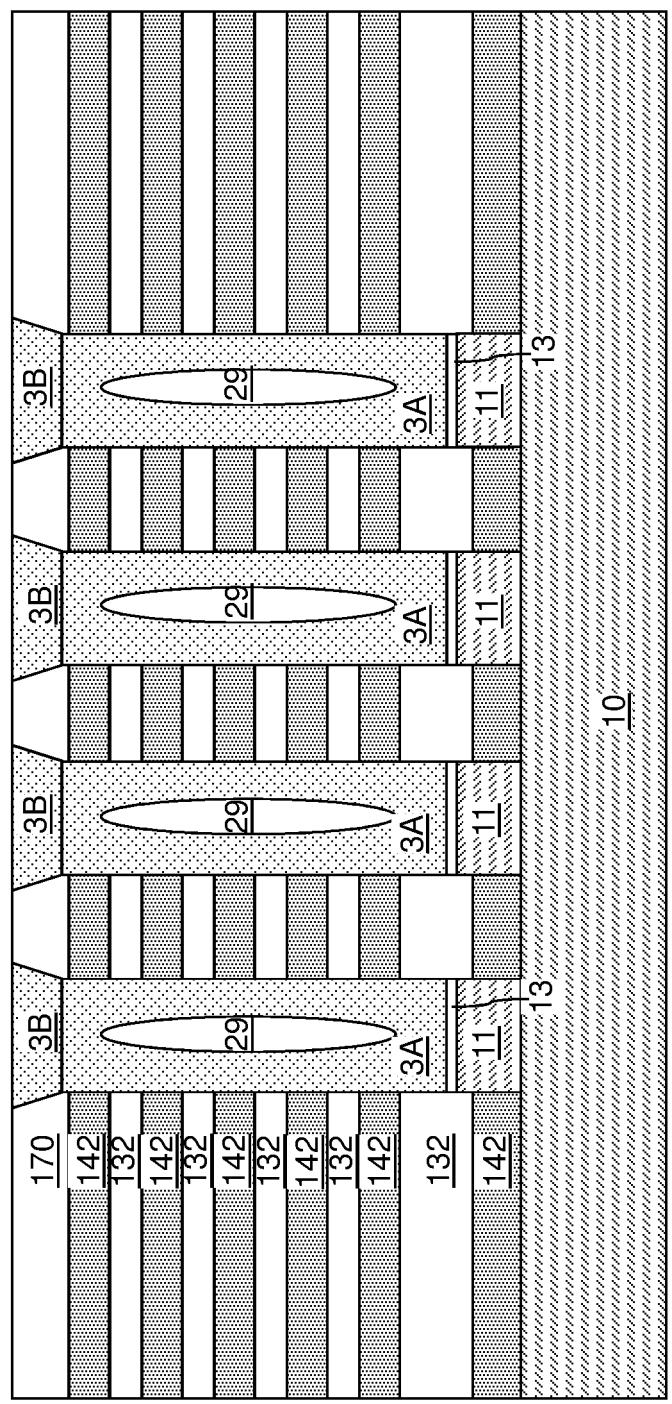
FIG. 5 is a vertical cross-sectional view of the exemplary structure after formation of temporary material portions according to an embodiment of the present disclosure.

Referring to FIG. 5, the temporary material layer 131 can be vertically recessed to form first temporary material portions 3A, which are remaining portions of the temporary material layer 131. Optionally, an anisotropic etch including an isotropic etch component (i.e., an anisotropic etch that has a significant isotropic etch component that reduces the directionality of the anisotropic etch) can be employed to form tapered openings in the first dielectric cap layer 170 over the first temporary material portions 3A. In this case, a laterally protruding tapered opening is formed over each first temporary material portion 3A. Each laterally protruding tapered opening can have a funnel shape, i.e., a decreasing horizontal cross-sectional area as a function of a depth from the top surface of the first dielectric cap layer 170. A second temporary material layer (not shown) can be deposited in the laterally protruding tapered openings and planarized employing the top surface of the first dielectric cap layer 170 as a planarization stop. Each remaining portion of the second temporary material layer constitutes a second temporary material portion 3B, which has funnel shape and having a wider top part than the top part of portion 3A. In one embodiment, the first and second temporary material portions (3A, 3B) can comprise a same semiconductor material such as polysilicon. Formation of the second temporary material portion 3B is optional. If the second temporary material portions 3B are not employed, the first temporary material portions 3A may extend to the horizontal plane including the top surface of the first dielectric cap layer 170. At least one temporary material portion (3A, 3B) is formed in an upper portion of each first memory opening 121.

Figure 6:
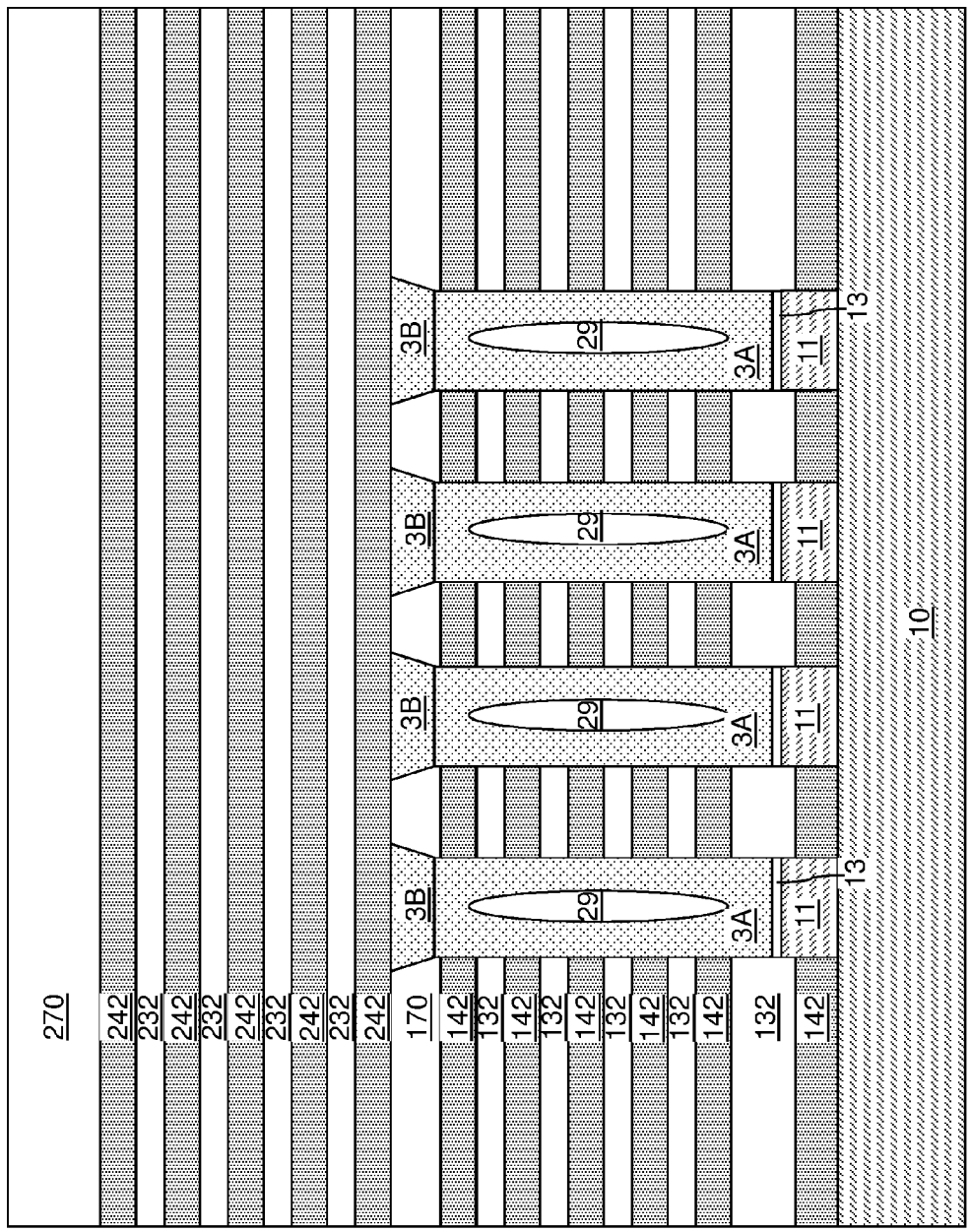
FIG. 6 is a vertical cross-sectional view of the exemplary structure after formation of a second alternating stack of second insulating layers and second sacrificial material layers according to an embodiment of the present disclosure.

Referring to FIG. 6, at least one additional tier structure can be optionally formed over the lower tier structure (132, 142). Each of the at least one additional tier structure can include an alternating stack of insulating layers and sacrificial material layers. For example, a second alternating stack (232, 242) of material layers can be subsequently formed on the top surface of the lower tier structure (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132 (e.g., silicon oxide layers). The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142 (e.g., silicon nitride layers). In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second dielectric cap layer 270 can be subsequently formed over the second stack (232, 242). The dielectric cap layer 270 includes a dielectric material that is different from the material of the second sacrificial material layers 242. In one embodiment, the dielectric cap layer 70 can include silicon oxide. In one embodiment, the first and second sacrificial material layers (142, 242) can comprise silicon nitride. Optionally, second stepped surfaces (not shown) can be region in the contact region in the same manner as formation of the first stepped surfaces. A second retro-stepped dielectric material portion may be formed over the second stepped surfaces.

Figure 7:
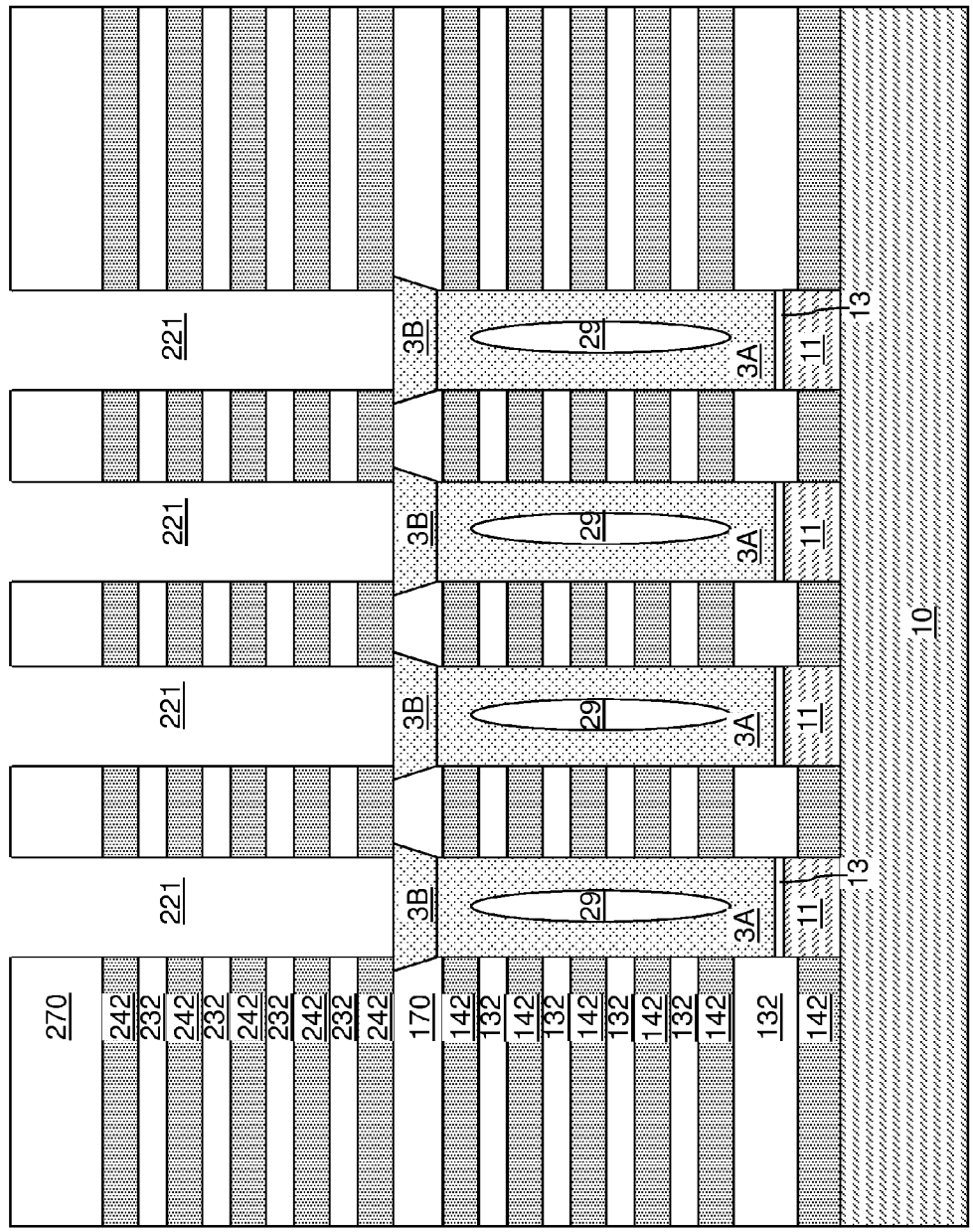
FIG. 7 is a vertical cross-sectional view of the exemplary structure after formation of second memory openings according to an embodiment of the present disclosure.

Referring to FIG. 7, second memory openings 221 can be formed through the upper tier structure (232, 242) in an area overlying the first memory openings 121, i.e., in areas that substantially coincides with the areas of the first memory openings 121. The second memory openings 221 can be formed to the top surface of the temporary material portions (3A, 3B). For example, a lithographic material stack (not shown) including at least a photoresist layer can be formed over the second dielectric cap layer 270 and the upper tier structure (232, 242), and can be lithographically patterned to form openings within the lithographic material stack. The pattern in the lithographic material stack can be transferred through the entirety of the upper tier structure (232, 242) by at least one anisotropic etch that employs the patterned lithographic material stack as an etch mask. Portions of the second dielectric cap layer 270 and the upper tier structure (232, 242) underlying the openings in the patterned lithographic material stack are etched to form the second memory openings 221. In other words, the transfer of the pattern in the patterned lithographic material stack through the second dielectric cap layer 270 and the upper tier structure (232, 242) forms the second memory openings 221.

In one embodiment, the chemistry of the anisotropic etch process employed to etch through the materials of the second stack (232, 242) can alternate to optimize etching of the third and fourth materials in the second stack (232, 242). The anisotropic etch can be, for example, a series of reactive ion etches. The sidewalls of the second memory openings 221 can be substantially vertical, or can be tapered. In one embodiment, the temporary material portions (3A, 3B) may be employed as stopping structures for the anisotropic etch process that forms the second memory openings 221.

Figure 8:
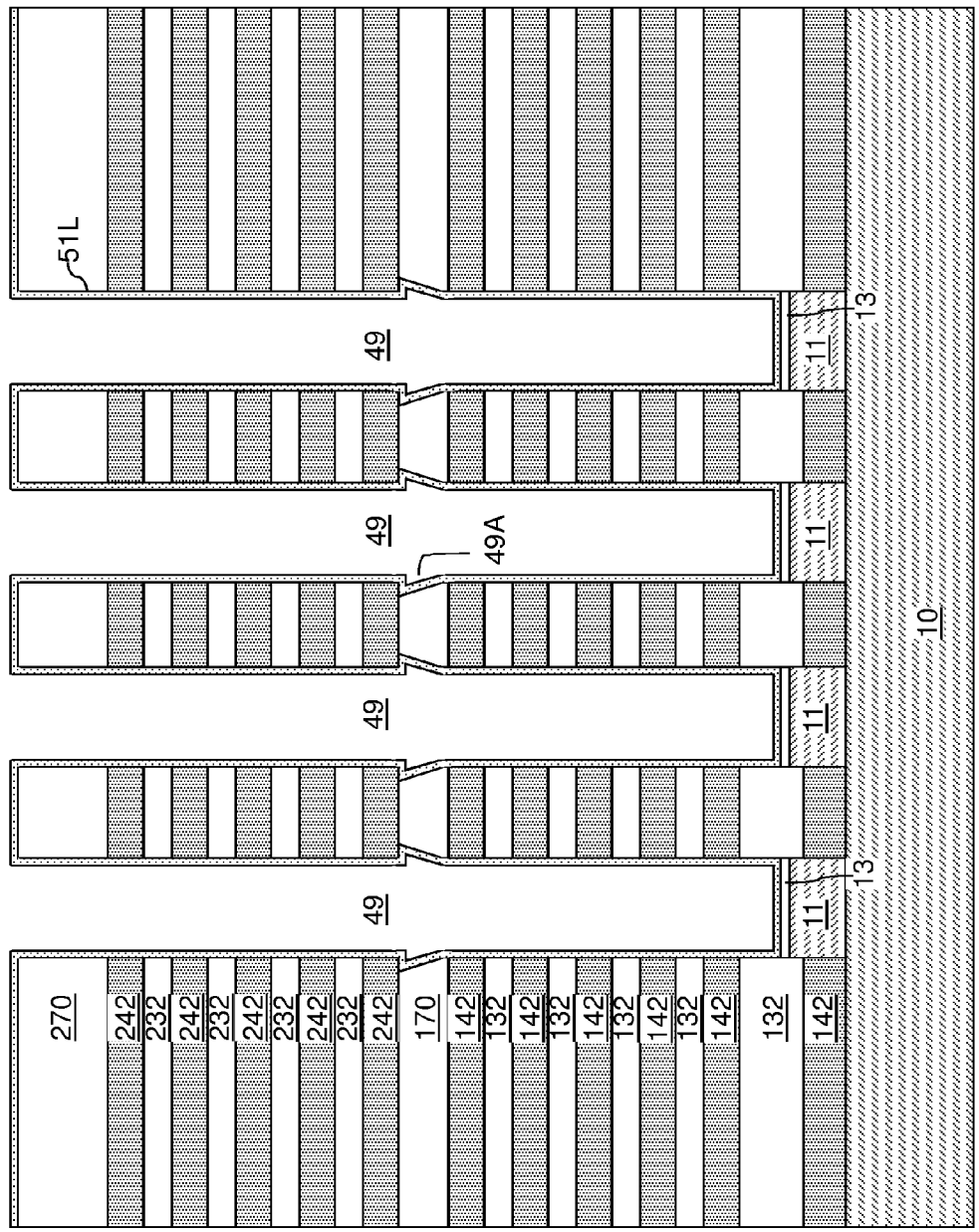
FIG. 8 is a vertical cross-sectional view of the exemplary structure after formation of a dielectric oxide layer according to an embodiment of the present disclosure.

Referring to FIG. 8, the temporary material portions (3A, 3B) can be removed selective to the materials of the first and second dielectric cap layers (170, 270) and the lower and upper tier structures (132, 142, 232, 242) and to the semiconductor oxide portions 13. In case the temporary material portions (3A, 3B) comprise a semiconductor material (such as polysilicon or amorphous silicon), an etch chemistry that removes the semiconductor material selective to dielectric materials can be employed. For example, a dry etch employing HCl or any wet etch process that removes the semiconductor material selective to dielectric materials can be employed. A plurality of memory openings 49 can be formed through the at least one tier structure (132, 142, 232, 242).

In general, at least one tier structure can be employed to form the plurality of openings 49 therethrough. In one embodiment, the protruding tapered portions of the temporary material portions (3A, 3B) can induce formation of a plurality of memory openings 49 each having a laterally protruding tapered portion 49A between a pair of tier structures within the plurality of tier structures.

Subsequently, a dielectric oxide layer ML can be formed directly on the sidewalls of the memory openings 49, over the second dielectric cap layer 270, and optionally directly on the semiconductor oxide portions 13 (in case the semiconductor oxide portions 13 are not collaterally removed during formation of the plurality of memory openings 49). Thus, the dielectric oxide layer ML is formed on the sidewalls of the first and second memory openings. The dielectric oxide layer 51L comprises a material that is different from the material of the first sacrificial material layers 142 and from the material of the second sacrificial material layers 242. In one embodiment, the dielectric oxide layer 51L can include silicon oxide or a dielectric metal oxide. In one embodiment, the dielectric oxide layer 51L can include a material different from aluminum oxide or silicon nitride. In one embodiment, the dielectric oxide layer 51L can include a conformal silicon oxide, which may be deposited, for example, by atomic layer deposition or chemical vapor deposition. The thickness of the dielectric oxide layer 51l can be in a range from 1 nm to 3 nm, although lesser and greater thicknesses can also be employed.

Figure 9:
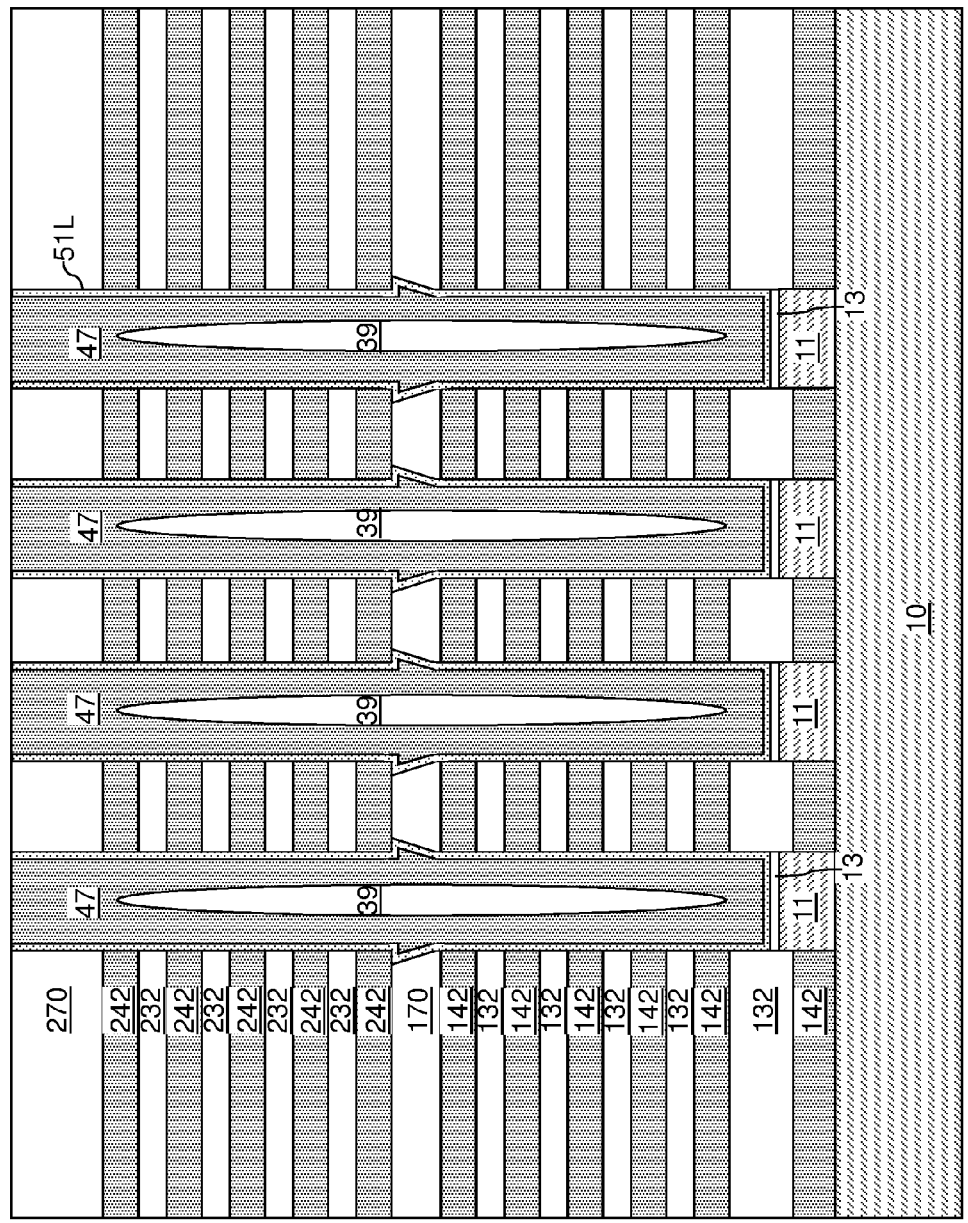
FIG. 9 is a vertical cross-sectional view of the exemplary structure after formation of a sacrificial memory opening fill structure according to an embodiment of the present disclosure.

Referring to FIG. 9, a sacrificial memory opening fill structure 47 can be formed within each memory opening 49. The sacrificial memory opening fill structures 47 can be formed by depositing a semiconductor material or a dielectric material that is different from the materials of the dielectric oxide layer 51L and the second dielectric cap layer 270, and subsequently removing portions of the semiconductor material or the dielectric material from above the horizontal plane including the top surface of the second dielectric cap layer 270. Optionally, the horizontal portion of the dielectric oxide layer 51L can be removed from above the second dielectric cap layer 270, and the dielectric oxide layer 51L can become a set of mutually disjoined layers each located within a respective memory opening.

Optionally, a non-conformal deposition process can be employed to deposit the semiconductor material or the dielectric material, and each sacrificial memory opening fill structure 47 can include an encapsulated cavity 39 therein. Each sacrificial memory opening fill structure 47 can extend through the first and second memory openings, which are respectively within the lower tier structure (132, 142) and the upper tier structure (232, 242). Each sacrificial memory opening fill structure 47 is formed on the dielectric oxide layer 51L.

In one embodiment, the first and second sacrificial material layers (142, 242) and the sacrificial memory opening fill structures 47 can comprise the same material that has a different composition than the dielectric oxide layer 51L. In one embodiment, the same dielectric material can be silicon nitride (which does not oxidize when a gate dielectric layer 12 is formed by oxidation of a semiconductor material 10 and 11, as described below), and the dielectric oxide layer 51L comprises a dielectric material selected from silicon oxide and a dielectric metal oxide. In one embodiment, the dielectric oxide layer 51L can include silicon oxide, such as silicon oxide deposited by atomic layer deposition.

Figure 10:
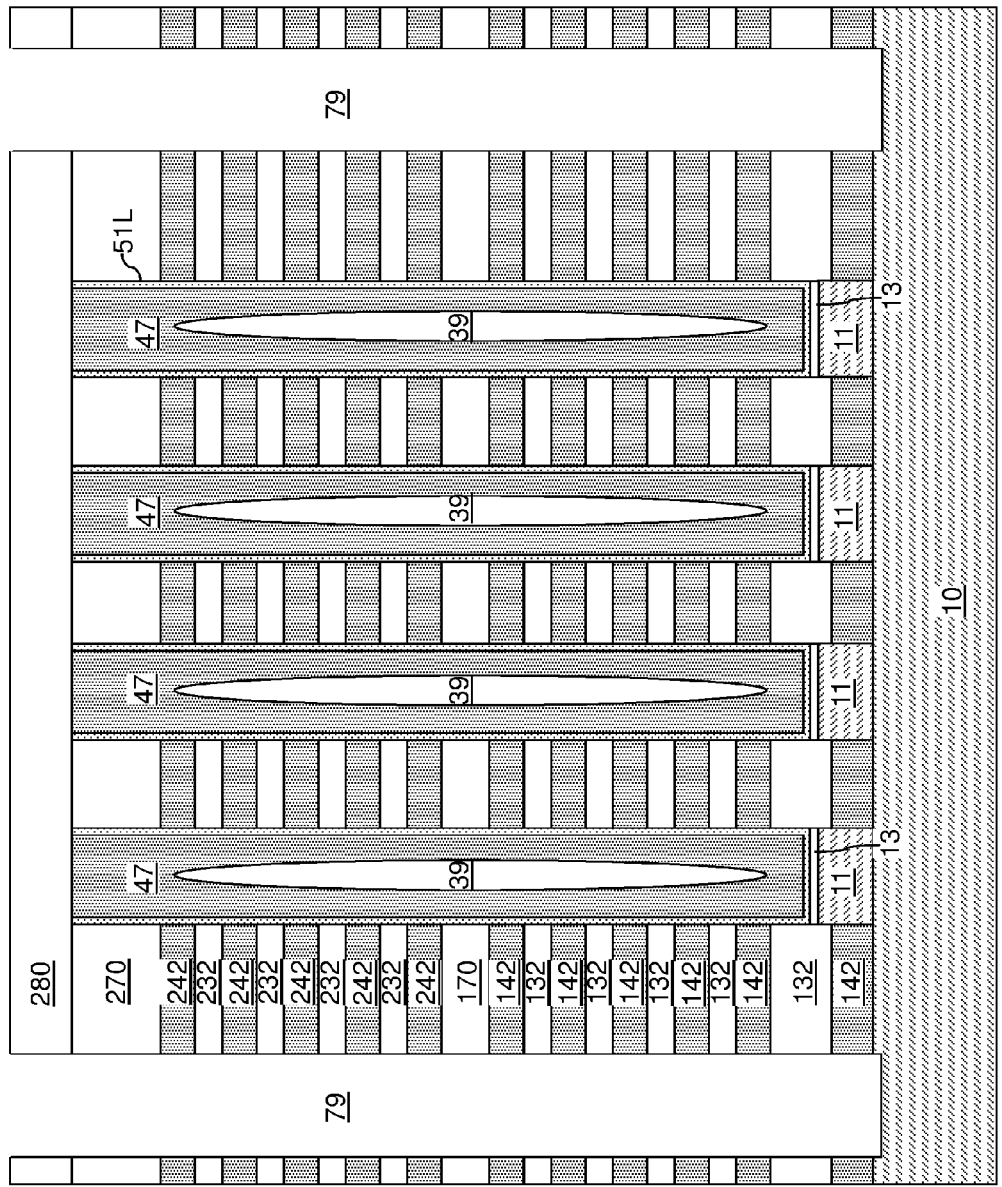
FIG. 10 is a vertical cross-sectional view of the exemplary structure after formation of a planarization material layer and backside trenches according to an embodiment of the present disclosure.

Referring to FIG. 10, a planarization material layer 280 can be formed over the second dielectric cap layer 270. The planarization material layer 280 may be selected as an in-process structure that is consumed during subsequent planarization processes. In one embodiment, the planarization material layer 280 can include a silicon oxide material deposited by chemical vapor deposition such as tetraethylorthosilicate (TEOS) silicon oxide. The thickness of the planarization material layer 280 can be in a range from 50 nm to 300 nm, although lesser and greater thicknesses can also be employed. Optional portion 49A is not shown in FIG. 10 for clarity.

At least one backside trench 79 can be formed through the upper and lower tier structures, for example, by applying a photoresist layer (not shown), lithographically patterning the photoresist layer, and transferring the pattern in the photoresist layer through the upper and lower tier structures employing an anisotropic etch. The anisotropic etch that forms the at least one backside trench 79 can stop on the substrate 10. The photoresist layer can be subsequently removed, for example, by ashing.

Figure 11:
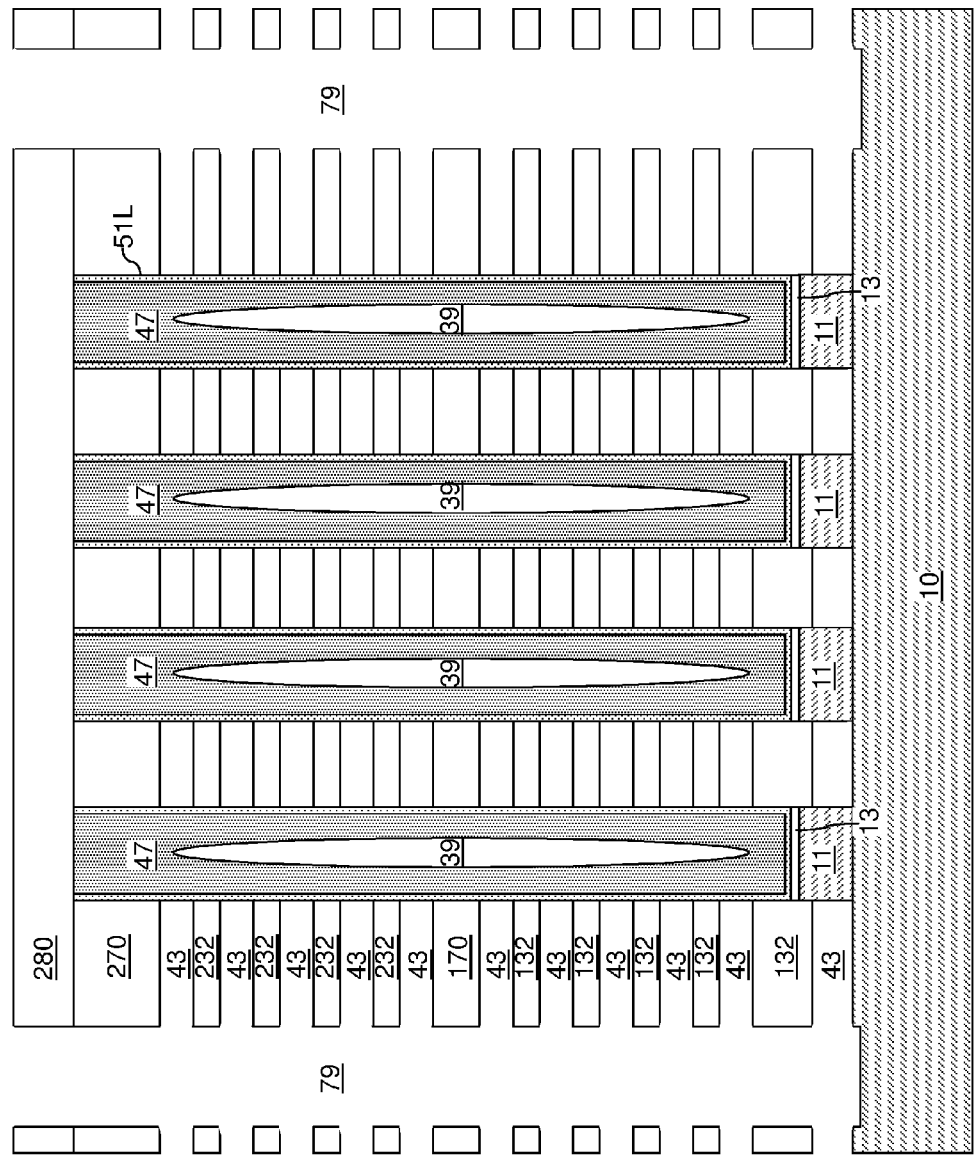
FIG. 11 is a vertical cross-sectional view of the exemplary structure after formation of backside recesses by removal of the sacrificial material layers according to an embodiment of the present disclosure.

Referring to FIG. 11, an etchant that selectively etches the materials of the first and second sacrificial material layers (142, 242) with respect to the materials of the first and second insulating layers (132, 232), the material of the dielectric oxide layer ML, and the first and second dielectric cap layers (170, 270) can be introduced into the backside trench 79, for example, employing an isotropic etch process. First backside recesses 43 are formed in volumes from which the first sacrificial material layers 142 are removed. Second backside recesses 43 are formed in volumes from which the second sacrificial material layers 242 are removed. The removal of the materials of the first and second sacrificial material layers (142, 242) can be selective to the materials of the first and second insulating layers (132, 232), and the material of the dielectric oxide layer 51L. In one embodiment, the first and second sacrificial material layers (142, 242) can include silicon nitride, and the materials of the first and second insulating layers (132, 232) can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the exemplary structure is immersed within a wet etch tank including hot phosphoric acid, which etches silicon nitride selective to silicon oxide, silicon, and various other materials employed in the art.

Each of the first and second backside recesses 43 can be a laterally extending cavity having a lateral dimension that is greater than the vertical extent of the cavity. In other words, the lateral dimension of each of the first and second backside recesses 43 can be greater than the height of the respective backside recess 43. A plurality of first backside recesses 43 can be formed in the volumes from which the material of the first sacrificial material layers 142 is removed. A plurality of second backside recesses 43 can be formed in the volumes from which the material of the second sacrificial material layers 242 is removed. Each of the first and second backside recesses 43 can extend substantially parallel to the top surface of the substrate 10. A backside recess 43 can be vertically bounded by a top surface of an underlying insulating layer (132 or 232) and a bottom surface of an overlying insulating layer (132 or 232). In one embodiment, each of the first and second backside recesses 43 can have a uniform height throughout.

In one embodiment, a sidewall surface of each epitaxial channel portion 11 and a top surface of a semiconductor material layer in the substrate, i.e., the substrate semiconductor layer 10, can be physically exposed below the bottommost first backside recess 43 after removal of the first and second sacrificial material layers (142, 242).

Figure 12:
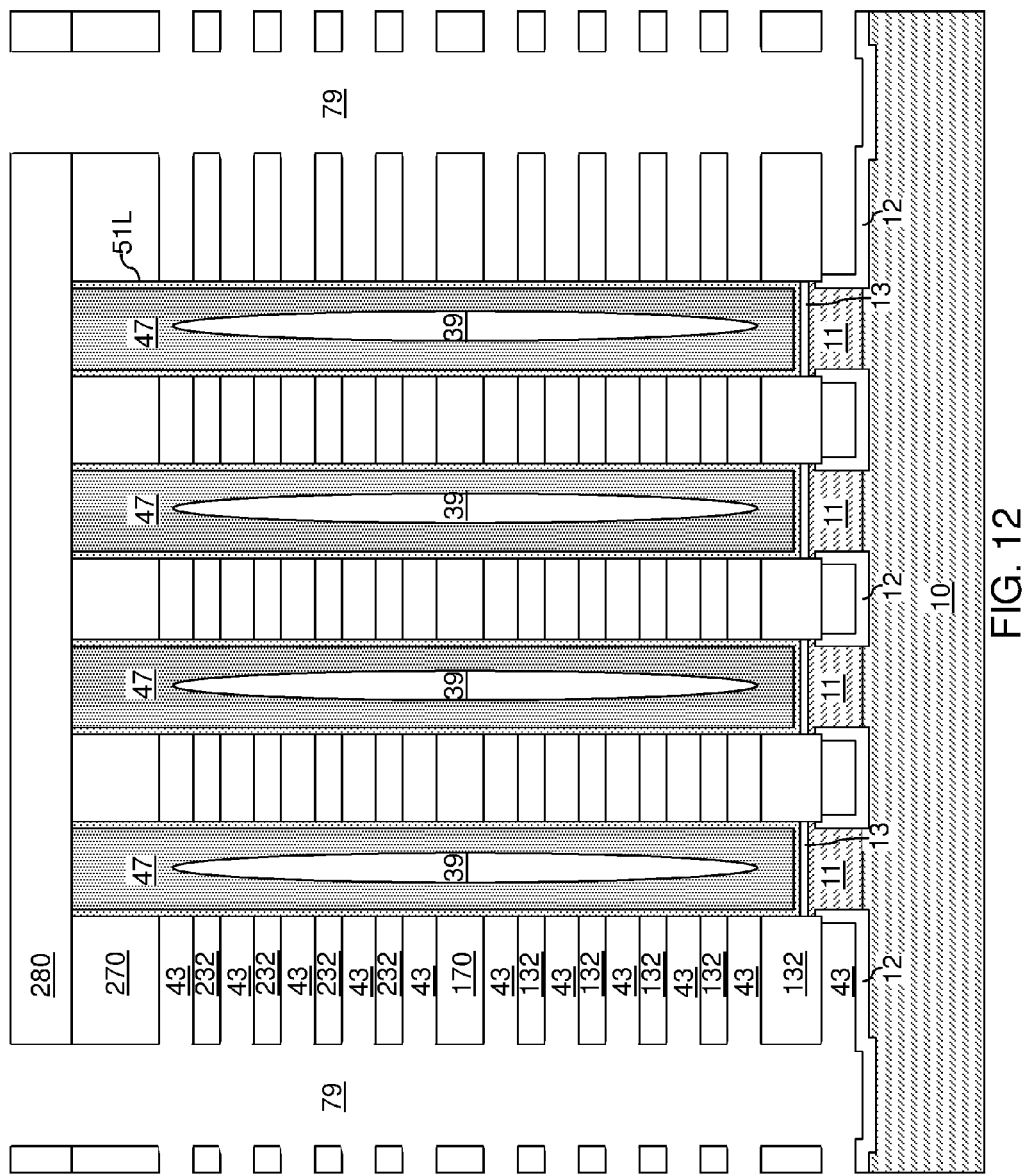
FIG. 12 is a vertical cross-sectional view of the exemplary structure after formation of a gate dielectric layer according to an embodiment of the present disclosure.

Referring to FIG. 12, a gate dielectric layer 12 can be formed by converting surface portions of the epitaxial channel portions 11 and the semiconductor material layer (the substrate semiconductor layer 10) into a continuous dielectric material layer. In one embodiment, the gate dielectric layer 12 can be formed by thermal conversion of the surface portions of the epitaxial channel portions 11 and the substrate semiconductor layer 10. In one embodiment, the thermal conversion process can include a thermal oxidation process (e.g., water vapor oxidation of silicon) and/or a thermal nitridation process. In one embodiment, the gate dielectric layer 12 can include a thermal oxide of the semiconductor material of the substrate semiconductor layer 10 and epitaxial channel portions 11. The gate dielectric layer 12 can be formed as a single continuous layer which is thicker than layer 51L.

Figure 13:
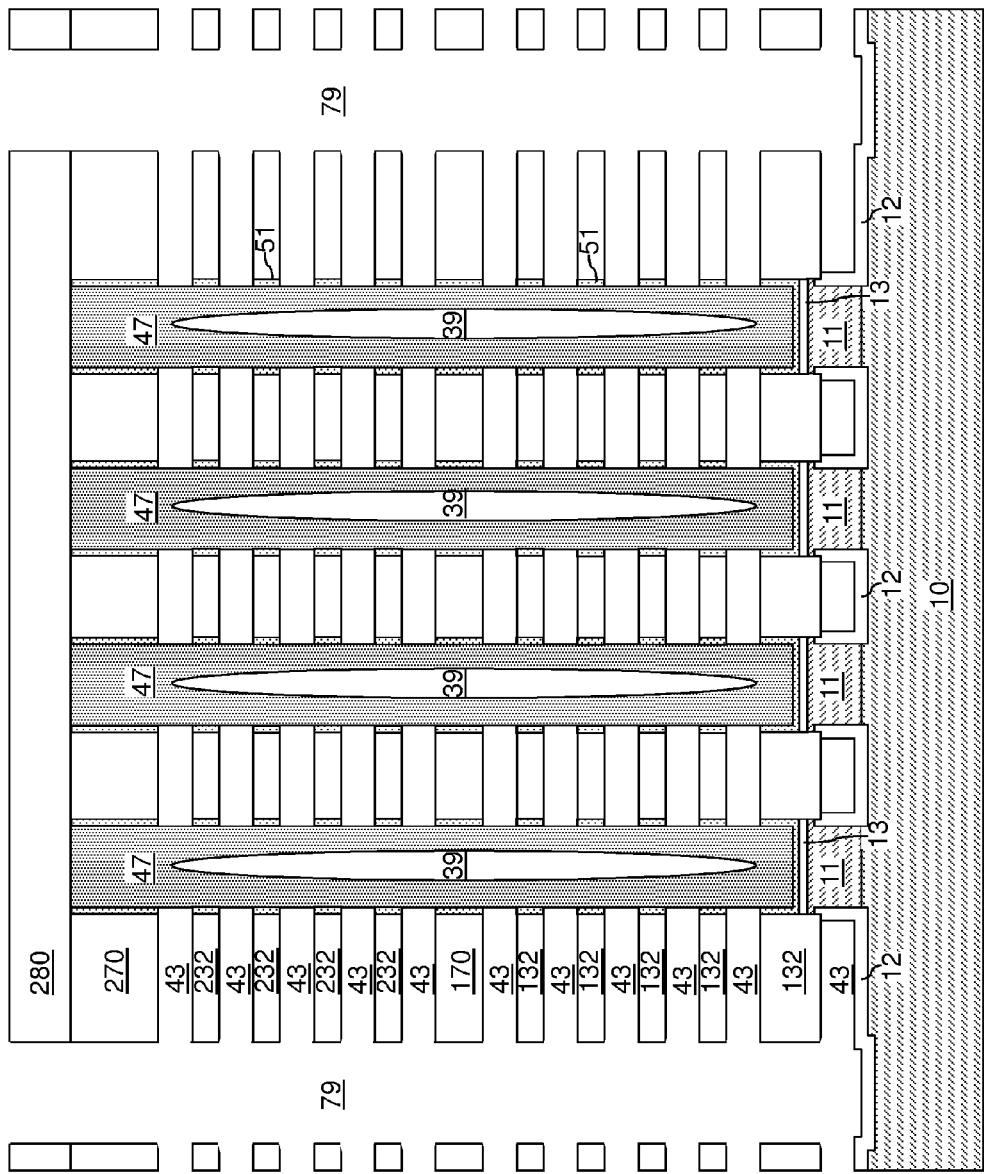
FIG. 13 is a vertical cross-sectional view of the exemplary structure after removal of physically exposed portions of the dielectric oxide layer to form annular dielectric oxide spacers according to an embodiment of the present disclosure.

Referring to FIG. 13, physically exposed portions of the dielectric oxide layer 51L can be removed to form annular dielectric oxide spacers 51 by a dilute HF etch or another suitable etch. The remaining portions of the dielectric oxide layer 51L located at levels of the first and second insulating layers (132, 232) constitute annular dielectric oxide spacers 51 vertically spaced from one another, and contacting outer sidewalls of the sacrificial memory opening fill structures 47. Portions of the outer surface of each sacrificial memory opening fill structure 47 can be physically exposed after removal of the physically exposed portions of the dielectric oxide layer 51L.

Figure 14:
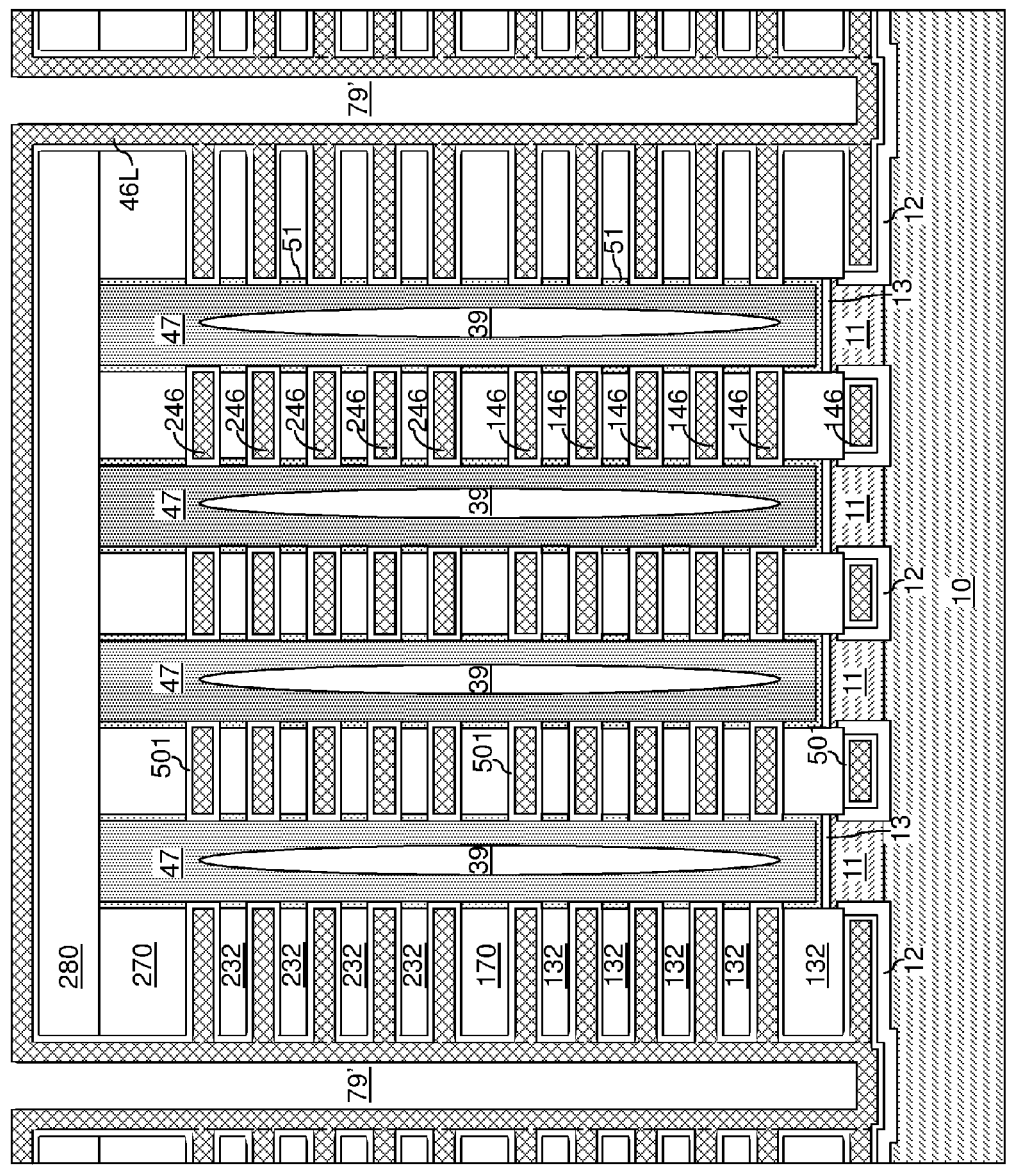
FIG. 14 is a vertical cross-sectional view of the exemplary structure after formation of a backside blocking dielectric and electrically conductive layers according to an embodiment of the present disclosure.

Referring to FIG. 14, a backside blocking dielectric 501 can be deposited in the backside recesses 43 and the backside trenches 79 and over the planarization dielectric layer 280. The backside blocking dielectric 501 can be deposited on the physically exposed portions of the outer surfaces of the sacrificial memory opening fill structures 47. The backside blocking dielectric 501 includes a dielectric material such as a dielectric metal oxide, silicon oxide, or a combination thereof. In one embodiment, the backside blocking dielectric 501 includes a dielectric material that is different from the dielectric material of the annular dielectric portions 51. In one embodiment, the backside blocking dielectric 501 can include aluminum oxide, such as amorphous aluminum oxide, and the dielectric oxide layer 51L (and the annular dielectric portions 51) can include a material that is different from aluminum oxide, such as silicon oxide. The backside blocking dielectric 501 can be formed by a conformal deposition process such as atomic layer deposition or chemical vapor deposition. The thickness of the backside blocking dielectric 501 can be in a range from 1 nm to 60 nm, although lesser and greater thicknesses can also be employed.

At least one conductive material can be deposited in the plurality of backside recesses 43, on the sidewalls of the backside trench 79, and over the planarization dielectric layer 280. The at least one conductive material can include at least one metallic material, i.e., an electrically conductive material that includes at least one metallic element.

A plurality of first electrically conductive layers 146 can be formed in the plurality of first backside recesses 43, a plurality of second electrically conductive layers 246 can be formed in the plurality of second backside recesses 43, and a continuous metallic material layer 46L can be formed on the sidewalls of each backside trench 79 and over the planarization dielectric layer 280. In embodiments in which the first spacer material layers and the second spacer material layers are provided as first sacrificial material layers 142 and second sacrificial material layers 242, the first and second sacrificial material layers (142, 242) can be replaced with the first and second conductive material layers (146, 246), respectively. Specifically, each first sacrificial material layer 142 can be replaced with a portion of the backside blocking dielectric 501 and a first electrically conductive layer 146, and each second sacrificial material layer 242 can be replaced with a portion of the backside blocking dielectric 501 and a second electrically conductive layer 246. A backside cavity is present in the portion of each backside trench 79 that is not filled with the continuous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses 43 can be a combination of titanium nitride layer and a tungsten fill material. In one embodiment, the metallic material can be deposited by chemical vapor deposition or atomic layer deposition.

Figure 15:
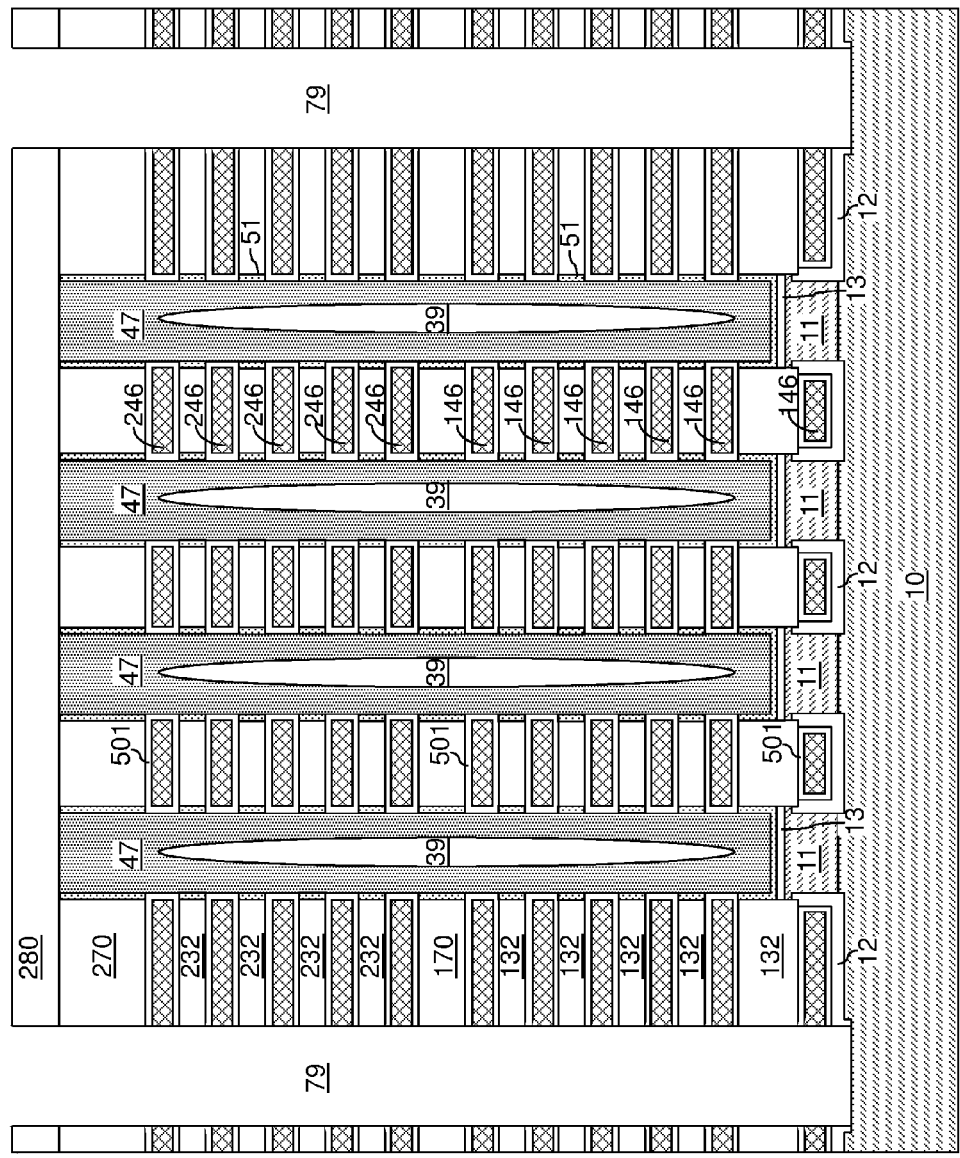
FIG. 15 is a vertical cross-sectional view of the exemplary structure after removal of residual materials from the backside trenches according to an embodiment of the present disclosure.

Referring to FIG. 15, residual material can be removed from each backside trench 79. Specifically, the deposited metallic material of the continuous metallic material layer 46L can be etched back from the sidewalls of each backside trench 79 and from above the planarization dielectric layer 280, for example, by an isotropic etch. Each remaining portion of the deposited metallic material in the first backside recesses 43 constitutes a first electrically conductive layer 146. Each remaining portion of the deposited metallic material in the second backside recesses 43 constitutes a second electrically conductive layer 246. Each electrically conductive layer (146, 246) can be a conductive line structure.

Each electrically conductive layer (146, 246) except the bottommost electrically conductive layer (i.e., the bottommost first electrically conductive layer 146) can function as a combination of a plurality of control gate electrodes located at a same level and a word line electrically interconnecting, i.e., electrically shorting, the plurality of control gate electrodes located at the same level. The control gate electrodes within each electrically conductive layer (146, 246) are the control gate electrodes for a vertical memory device including memory stack structures to be subsequently formed in the volumes of the sacrificial memory opening fill structures 47.

One or more of the bottommost first electrically conductive layer 146 can be a source select gate electrode located over the gate dielectric layer 12, which can control activation of a horizontal channel portion of a semiconductor channel that extends between a source region (to be subsequently formed underneath each backside trench 79) and the epitaxial channel portions 11. One or more of the topmost second electrically conductive layer 246 can be a drain select gate electrode. In one embodiment, the backside blocking dielectric 501 may be present as a single continuous material layer. In another embodiment, the vertical portions of the backside blocking dielectric 501 may be removed from within the backside trenches 79, and the backside blocking dielectric 501 can have a plurality of physically disjoined backside blocking dielectric portions that are located at each level of the electrically conductive layers (146, 246).

Figure 16:
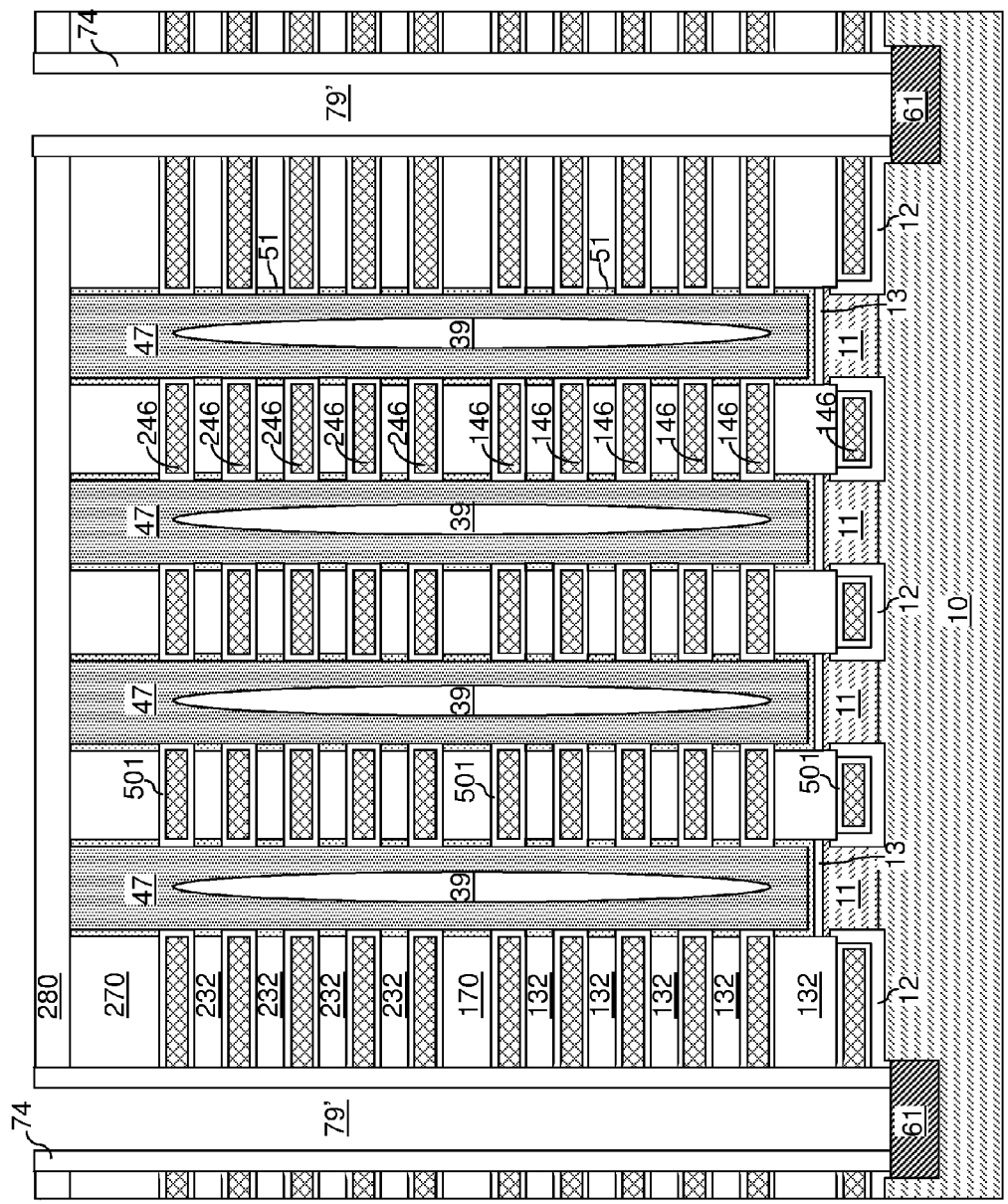
FIG. 16 is vertical cross-sectional view of the exemplary structure after formation of first active regions and insulating spacers according to an embodiment of the present disclosure.

Referring to FIG. 16, dopants of a second conductivity type, which is the opposite of the first conductivity type of the substrate semiconductor layer 10, can be implanted into a surface portion of the substrate semiconductor layer 10 to form a first active region 61 underneath the bottom surface of each backside trench 79. As used herein, an "active region" refers to a source region or a drain region of a transistor, preferably the source region. An insulating spacer 74 including a dielectric material can be formed at the periphery of each backside trench 79, for example, by deposition of a conformal insulating material (such as silicon oxide) and a subsequent anisotropic etch. The planarization dielectric layer 280 may be thinned due to a collateral etch during the anisotropic etch that removes the vertical portions of horizontal portions of the deposited conformal insulating material. An anneal step may be conducted to activate the dopants in the active region 61 and to crystallize the amorphous aluminum oxide layer 501 to form a polycrystalline aluminum oxide blocking dielectric layer 501.

Figure 17:
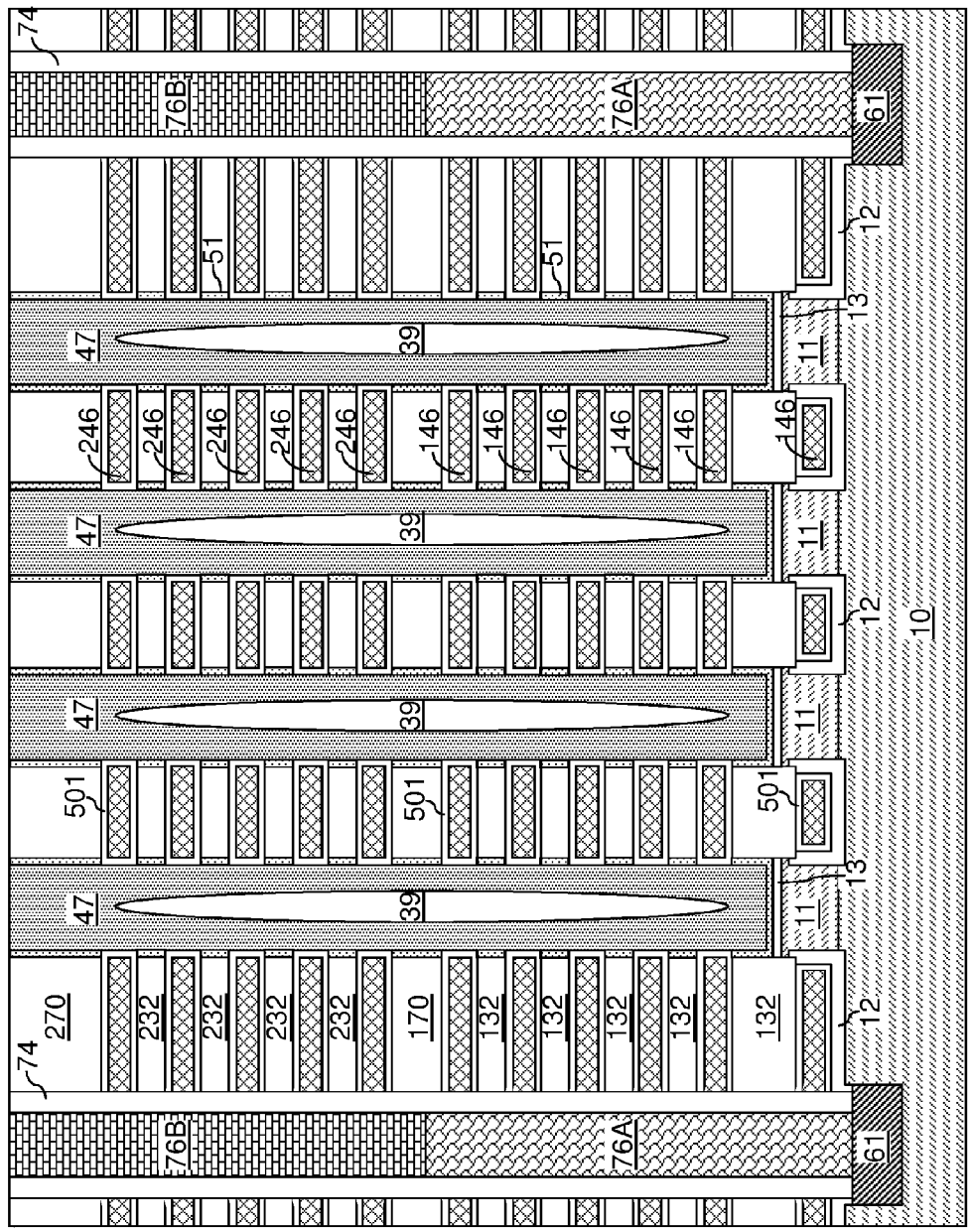
FIG. 17 is a vertical cross-sectional view of the exemplary structure after formation of backside contact via structures according to an embodiment of the present disclosure.

Referring to FIG. 17, a backside contact via structure (76A, 76B) can be formed in the remaining volume of each backside trench 79, for example, by deposition of at least one conductive material and removal of excess portions of the deposited at least one conductive material from above a horizontal plane including the top surface of the planarization dielectric layer 80 by a planarization process such as chemical mechanical planarization or a recess etch. Optionally, each backside contact via structure (76A, 76B) may include multiple backside contact via portions such as a lower backside contact via portion 76A and an upper backside contact via portion 76B. In an illustrative example, the lower backside contact via portion 76A can include a doped semiconductor material (such as doped polysilicon), and can be formed by depositing the doped semiconductor material layer to fill the backside trenches 79 and removing the deposited doped semiconductor material from upper portions of the backside trenches 79. The upper backside contact via portion 76B can include at least one metallic material (such as a combination of a TiN liner and a W fill material), and can be formed by depositing the at least one metallic material above the lower backside contact via portions 76A, and removing an excess portion of the at least one metallic material from above the horizontal plane including the top surface of the planarization dielectric layer 280. The planarization dielectric layer 280 can be thinned and removed during a latter part of the planarization process, which may employ chemical mechanical planarization (CMP), a recess etch, or a combination thereof. Each backside contact via structure (76A, 76B) can be formed through the at least one tier structure (132, 146, 232, 246) and on a first active region 61, which may be a source region. The top surface of each backside contact via structure (76A, 76B) can be formed within the horizontal plane that includes the top surfaces of the sacrificial memory opening fill structures 47, which are exposed after removal of layer 280.

Figure 18:
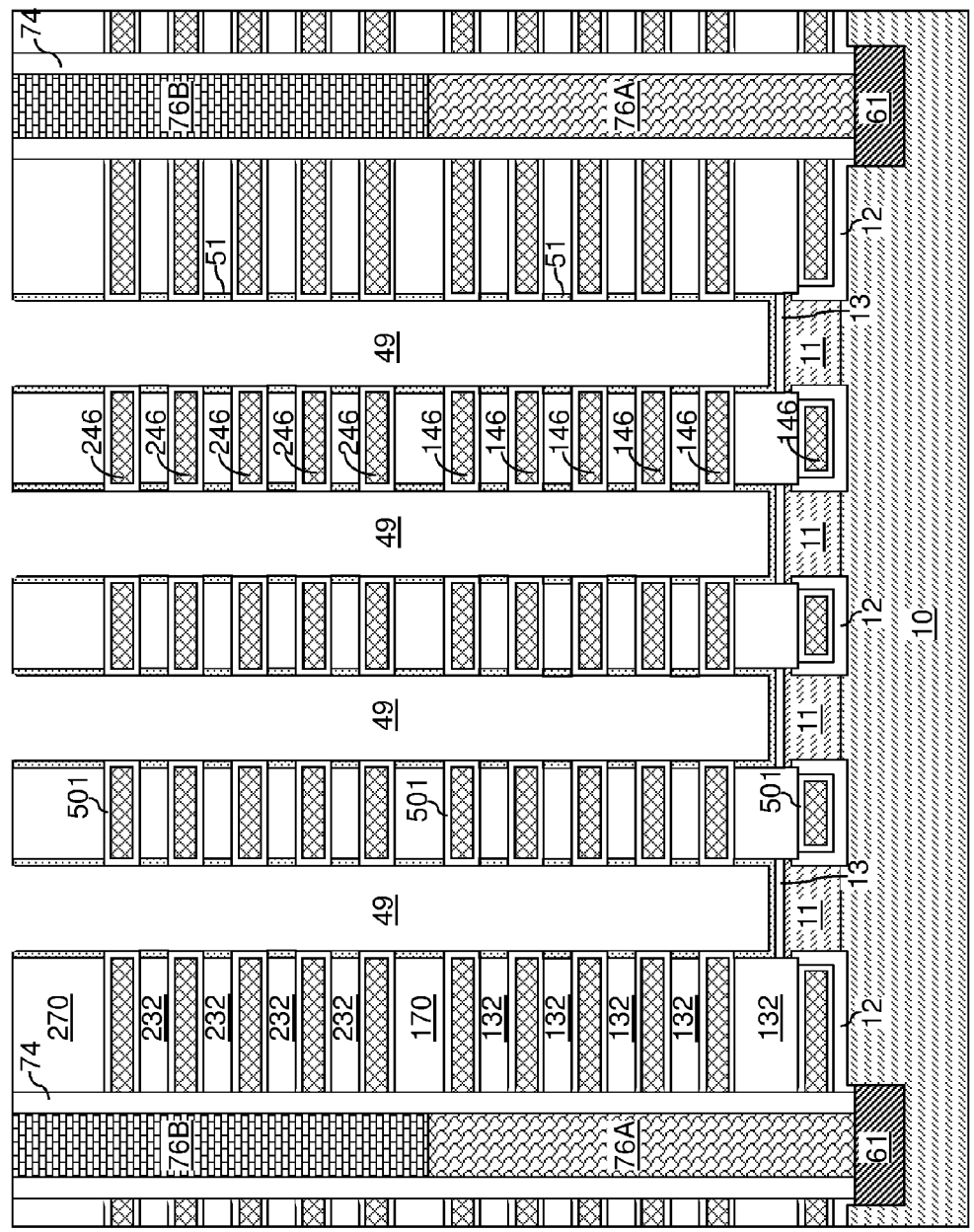
FIG. 18 is a vertical cross-sectional view of the exemplary structure after removal of the sacrificial memory opening fill structures according to an embodiment of the present disclosure.

Referring to FIG. 18, the sacrificial memory opening fill structures 47 can be removed selective to the annular dielectric oxide spacers 51, the backside blocking dielectric 501, the insulating spacers 74, the backside contact via structures (76A, 76B), and the second dielectric cap layer 270. In an illustrative example, if the sacrificial memory opening fill structure 47 include silicon nitride, a wet etch employing hot phosphoric acid may be employed to remove the sacrificial memory opening fill structures selective to the materials of the annular dielectric oxide spacers 51, the backside blocking dielectric 501, the insulating spacers 74, the backside contact via structures (76A, 76B), and the second dielectric cap layer 270 to form a memory opening 49 through the first and the second tiers (i.e., through the first and second stacks). Inner sidewalls of the backside blocking dielectric 501 are physically exposed in each memory opening 49 after removal of the sacrificial memory opening fill structures 47. Further, inner sidewalls of the annular dielectric oxide spacers 51 are physically exposed in each memory opening 49 after removal of the sacrificial memory opening fill structures 47.

Figure 19:
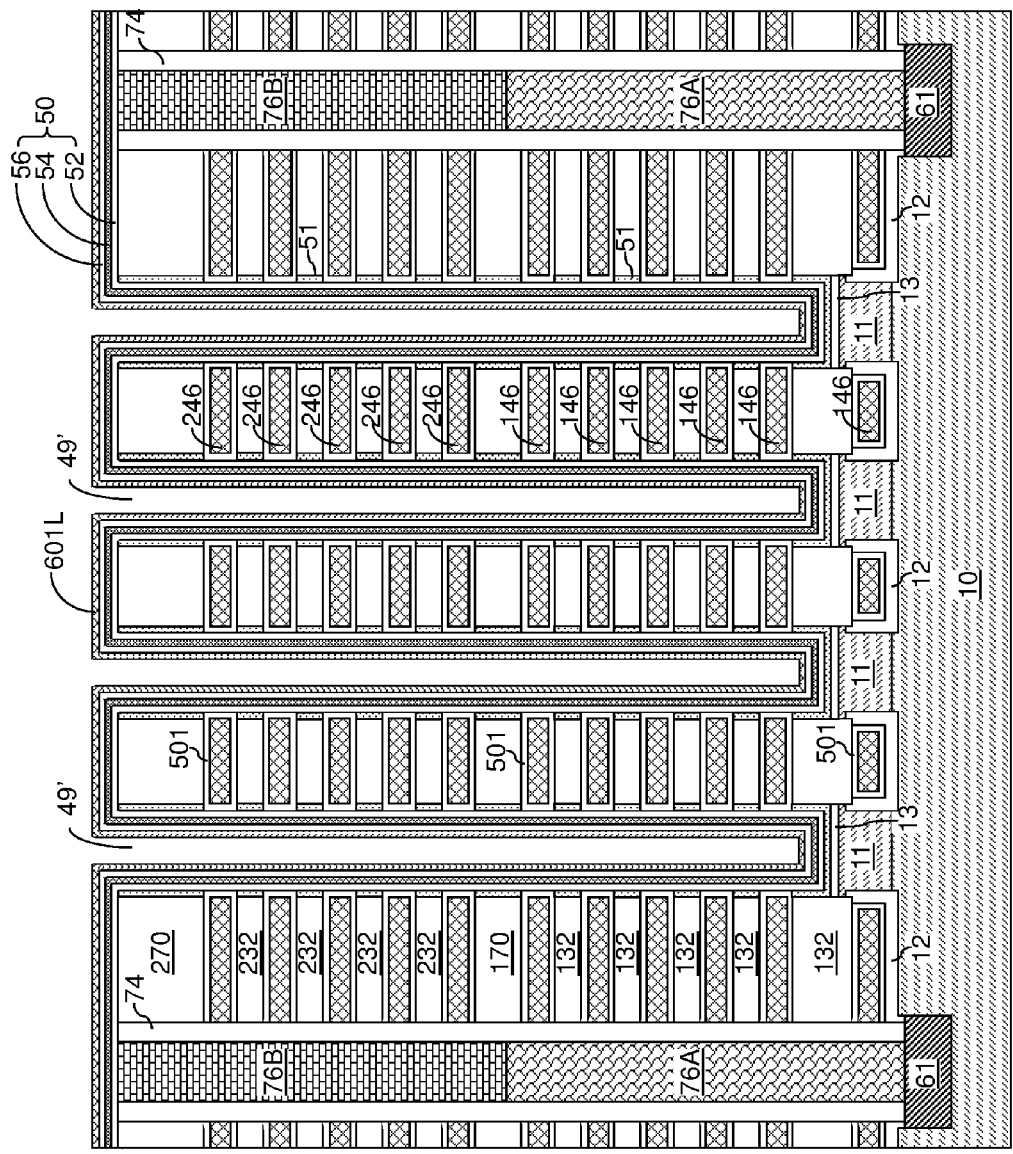
FIG. 19 is a vertical cross-sectional view of the exemplary structure after formation of a memory film and a first semiconductor channel layer according to an embodiment of the present disclosure.

Subsequently, a memory stack structure can be formed on the inner sidewalls of the backside blocking dielectric 501 and on the inner sidewalls of the annular dielectric oxide spacers 51 within each memory opening 49. Referring to FIG. 19, a memory film and a first semiconductor channel layer 601L can be formed in the memory openings and over the second dielectric cap layer 270. The memory film 50 can include, from outside to inside, an optional front side blocking dielectric layer 52, a memory material layer 54 (which can be a charge trapping layer), and a tunneling dielectric 56.

Specifically, a blocking dielectric layer 52, a memory material layer 54, a tunneling dielectric layer 56, and a first semiconductor channel layer 601L can be sequentially deposited as conformal material layers in the memory openings 49 and over the second dielectric cap layer 270 and the upper tier structure (232, 246). The blocking dielectric layer 52 includes a blocking dielectric material such as silicon oxide, a dielectric metal oxide (such as aluminum oxide), or a combination thereof. Alternatively, the blocking dielectric layer 52 may be omitted and the backside blocking dielectric 501 may be used as the sole blocking dielectric of the device. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. Each portion of the memory material layer 54 located at the levels of the electrically conductive layers (146, 246).

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack.

In one embodiment, the ONO stack can be formed by deposition of a silicon oxide layer, nitridation of a surface portion of the silicon oxide layer into a silicon oxynitride layer, and oxidation of a surface portion of the silicon oxynitride layer into the second silicon oxide layer. The portion of the silicon oxide layer that is not converted into the silicon oxynitride layer is the first silicon oxide layer within the ONO stack, and the portion of the silicon oxynitride layer that is not converted into the second silicon oxide layer is the silicon oxynitride layer within the ONO stack. Alternatively, the second silicon oxide layer can be formed by deposition of silicon oxide on the inner sidewalls of the silicon oxynitride layer that is formed by nitridation. In one embodiment, the tunneling dielectric layer 56 can include a silicon oxide layer that is substantially free of carbon and/or a silicon oxynitride layer that is substantially free of carbon. The thickness of the tunneling dielectric layer 56 can be in a range from 2 nm to 20 nm, although lesser and greater thicknesses can also be employed.

The first semiconductor channel layer 601L can be formed over the tunneling dielectric layer 56. The first semiconductor channel layer 601L can be deposited directly on the tunneling dielectric layer 56. The first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A memory cavity 49' is present in each memory opening after formation of the first semiconductor channel layer 601L.

Figure 20:
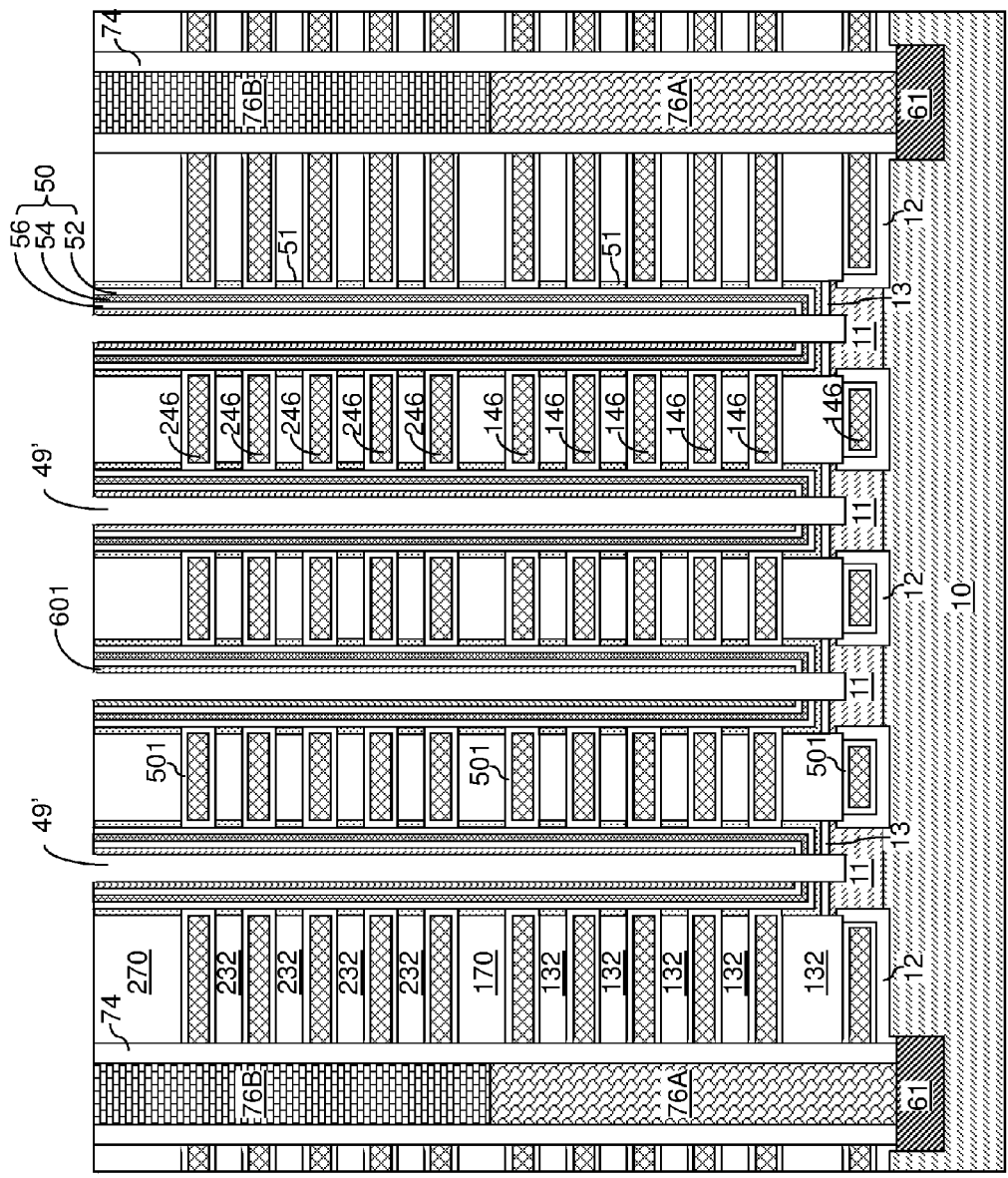
FIG. 20 is a vertical cross-sectional view of the exemplary structure after an anisotropic etch process that physically exposes surfaces of the epitaxial channel portions according to an embodiment of the present disclosure.

Referring to FIG. 20, an anisotropic etch is performed to remove horizontal portions of the first semiconductor channel layer 601L, the tunneling dielectric layer 56, the memory material layer 54, and the blocking dielectric layer 52, the semiconductor oxide portions 13, and to physically expose a surface of each epitaxial channel portion 11. Horizontal portions of the first semiconductor channel layer 601L, the tunneling dielectric layer 56, the memory material layer 54, and the blocking dielectric layer 52 are removed from above the second dielectric cap layer 270. Each continuous set of remaining portions of the memory material layer 54, the tunneling dielectric layer 56 and optionally the blocking dielectric layer 52 within a same memory opening constitutes a memory film 50. Each remaining portion of the first semiconductor channel layer 601L constitutes a first channel portion 601, such as a polycrystalline channel portion if its material comprises polysilicon or another polycrystalline semiconductor material.

Figure 21:
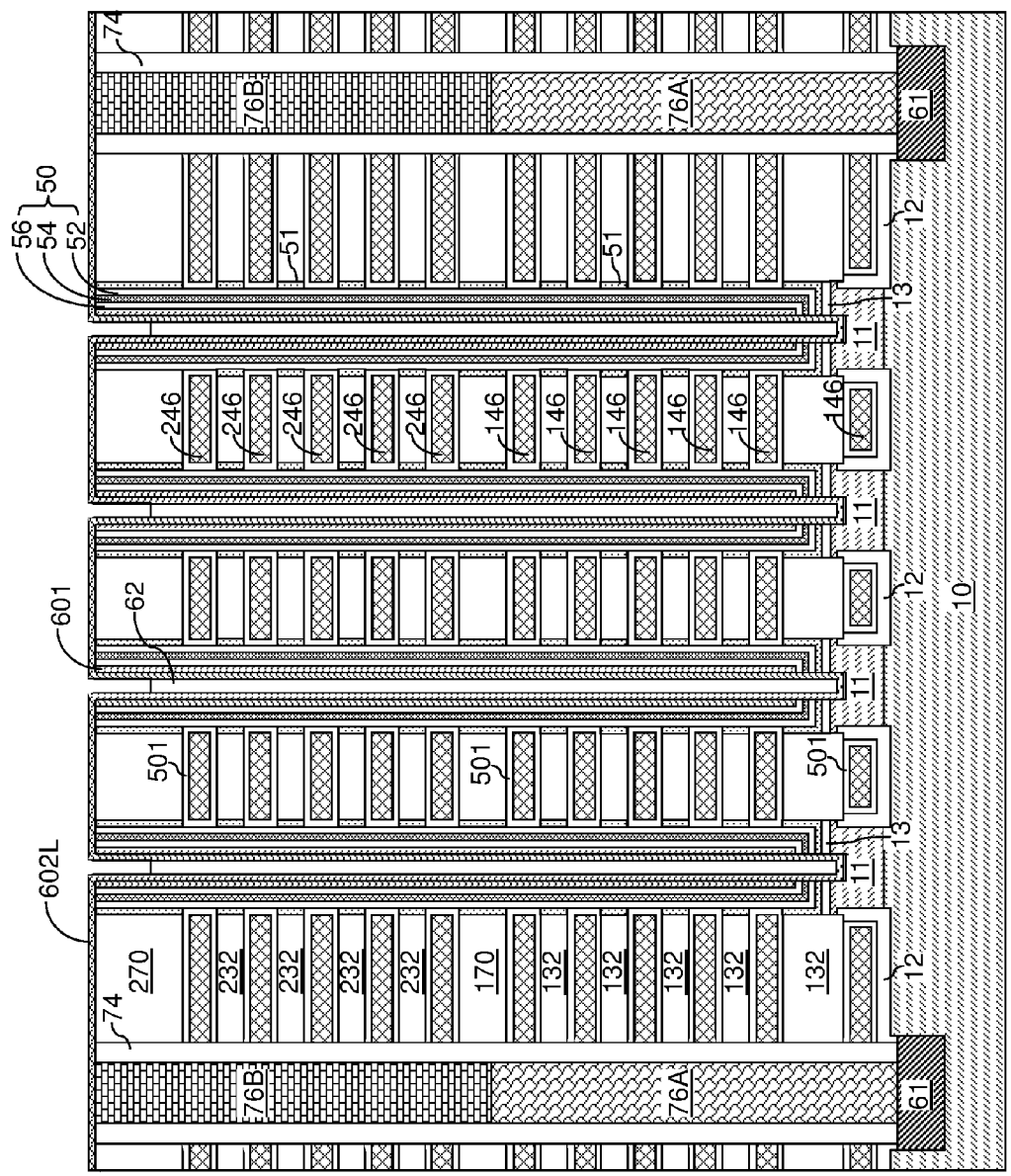
FIG. 21 is a vertical cross-sectional view of the exemplary structure after deposition of a second semiconductor channel layer and formation of dielectric cores according to an embodiment of the present disclosure.

Referring to FIG. 21, a second semiconductor channel layer 602L can be deposited on the first channel portions 601 (i.e., the remaining vertical portions of the first semiconductor channel layer 601L) and on top surface of the epitaxial channel portions 11. The second semiconductor channel layer 602L includes a semiconductor material, which can be any semiconductor material that can be employed for the first semiconductor channel layer 601L. The first and second semiconductor channel layers (601L, 602L) can have a doping of the first conductivity type (i.e., the same conductivity type as the substrate semiconductor layer 10) or can be substantially intrinsic. As used herein, a semiconductor material is substantially intrinsic if the dopant concentration does not exceed $1.0 \times 10^{16}/cm^3$. In one embodiment, the second semiconductor channel layer 602L can include amorphous silicon or polysilicon. The thickness of the second semiconductor channel layer 602L can be in a range from 2 nm to 10 nm, although lesser and greater thicknesses can also be employed. If desired, a crystallization anneal can be performed to convert any amorphous material(s) of the first and/or second semiconductor channel layer(s) (601L, 602L) into a polycrystalline material, or to increase the grain size of the polycrystalline material(s) of the first and/or second semiconductor channel layer(s) (601L, 602L). The temperature of the crystallization anneal is performed at a temperature that is effective in crystallizing the semiconductor material(s) of the first and/or second semiconductor channel layers (601L, 602L), which is at least 600 degrees Celsius.

In one embodiment, the cavity in each memory opening 49 is not completely filled by the semiconductor channel layers (601, 602), a dielectric core layer can be deposited in the cavities to fill any remaining portion of the cavities within the memory openings 49. The dielectric core layer includes a hydrogen-isotope rich dielectric material. As used herein, a hydrogen isotope" refers to any atom having a single proton in a nucleus, and thus, can be a hydrogen atom, a deuterium atom, or a tritium atom. As used herein, a "hydrogen-isotope rich dielectric material" refers to a dielectric material including a hydrogen isotope at an atomic concentration greater than 0.01 atomic percent (i.e., 100 parts per million). In one embodiment, the atomic concentration of the hydrogen-rich dielectric material can be greater than $1 \times 10^{18}/cm^3$, such as in a range from $5.0 \times 10^{18}/cm^3$ to $1.0 \times 10^{22}/cm^3$, including $1 \times 10^{19}/cm^3$ to $1.0 \times 10^{22}/cm^3$, although a greater atomic concentration can also be employed. In one embodiment, the hydrogen-isotope rich dielectric material can include silicon oxide or silicon nitride. In one embodiment, the hydrogen-isotope rich dielectric material can include hydrogen-rich silicon nitride, which can be formed by a plasma enhanced chemical vapor deposition (PECVD) such as one described in U.S. Pat. No. 6,372,569. Alternatively, the hydrogen-rich dielectric material can include hydrogen-rich silicon oxide formed using a hydrogen containing organic precursor, such as a spin-on-glass (SOG), which can be deposited by spin coating.

Subsequently, the horizontal portion of the dielectric core layer can be removed, for example, by a recess etch from above the top surface of the second insulating cap layer 270. The recess etch continues until the top surfaces of remaining portions of the dielectric core layer are recessed below the top surface of the second dielectric cap layer 270. Each remaining portion of the dielectric core layer constitutes a dielectric core 62. The top surface of each dielectric core 62 can be formed between a first horizontal plane including the top surface of the second dielectric cap layer 270 and a second horizontal plane including the bottom surface of the second dielectric cap layer 270.

Figure 22:
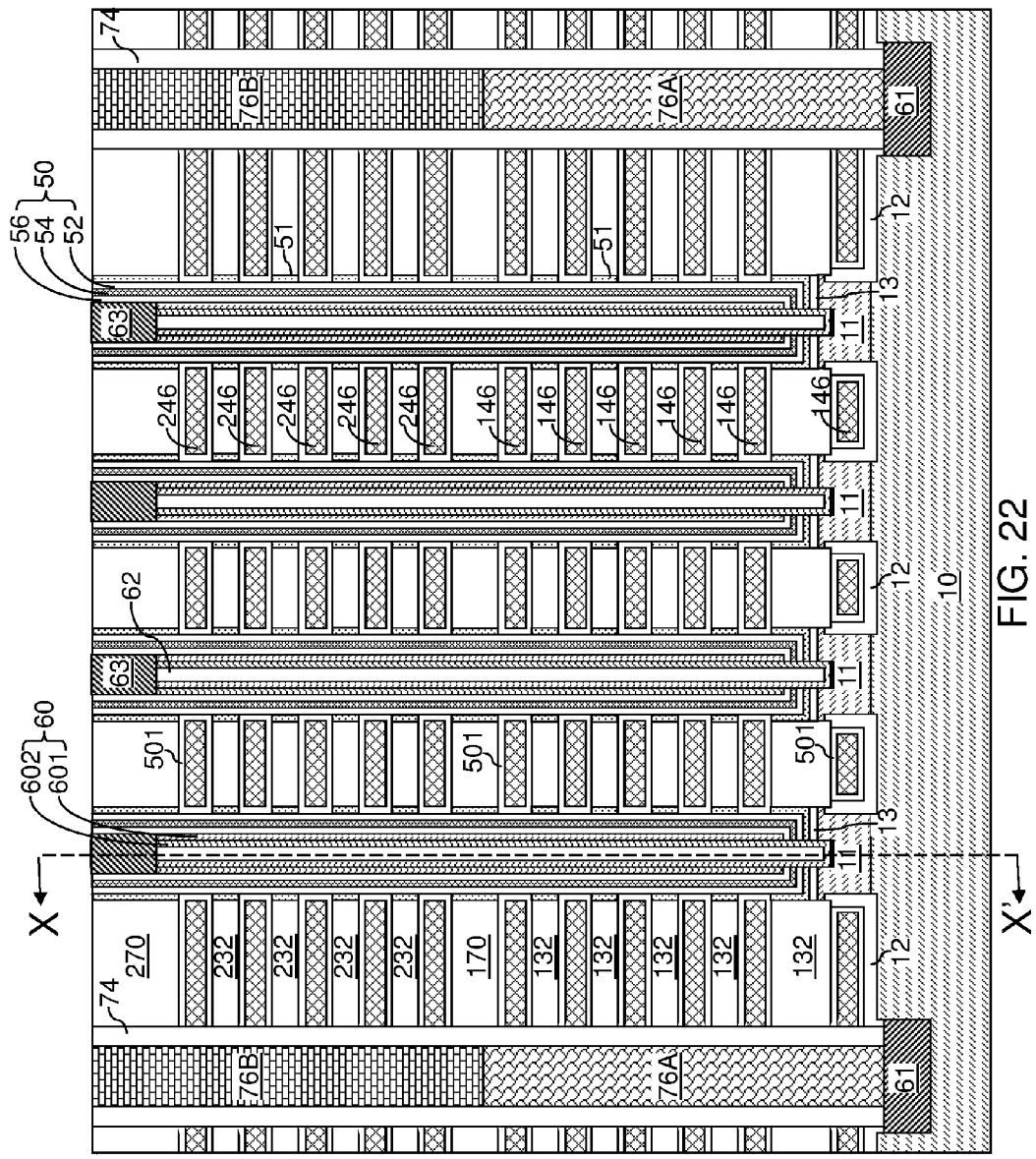
FIG. 22 is a vertical cross-sectional view of the exemplary structure after formation of second active regions according to an embodiment of the present disclosure.

Referring to FIG. 22, the horizontal portion of the second semiconductor channel layer 602L located above the top surface of the planarization dielectric layer 270 can be removed by a planarization process, which can employ a recess etch or chemical mechanical planarization (CMP) to form the second channel portion 602. Each remaining portion (601, 602) of the first and second semiconductor channel layers (601L, 602L) within a memory opening constitutes a polycrystalline channel portion 60, which is a vertical portion of a semiconductor channel. The semiconductor channel further includes a horizontal semiconductor channel that is present between the epitaxial channel portions 11 and the first active regions 61 in an upper portion of the substrate semiconductor layer 10. The combination of the memory film 50 and the polycrystalline channel portion 60 forms a memory stack structure (50, 60). Thus, the sacrificial memory opening fill structures 47 are replaced with memory stack structures (50, 60) that includes a plurality of charge storage regions (as embodied by portions of the memory material layer 54) located at levels of the electrically conductive layers (146, 246).

A second active region 63 can be formed by depositing a doped semiconductor material within each recessed region above the dielectric cores 62. The doped semiconductor material can be, for example, doped polysilicon. Excess portions of the deposited semiconductor material can be removed from above the top surface of the second dielectric cap layer 270, for example, by chemical mechanical planarization (CMP) or a recess etch to form the second active region 63, such as a drain region. Electrical current can flow through the polycrystalline channel portion 60 when a vertical NAND device including the polycrystalline channel portion 60 is turned on. A tunneling dielectric 56 is laterally surrounded by a memory material layer 54, and laterally surrounds a portion of the polycrystalline channel portion 60. Each memory film 50 can store electrical charges with a macroscopic retention time. As used herein, a macroscopic retention time refers to a retention time suitable for operation of a memory device as a permanent memory device such as a retention time in excess of 24 hours.

In one embodiment, the conductivity of the polycrystalline channel portions 60 can be enhanced by passivating surfaces states through introduction of hydrogen isotope atoms from the dielectric core to the polycrystalline channel portions 60. Specifically, an anneal process can be performed at an elevated temperature in a range from 375 degrees Celsius to 500 degrees Celsius, such as from 400 degrees Celsius to 475 degrees Celsius, for 15 to 60 minutes, such as 30 to 45 minutes, in 10 to 40 atmospheres, such as 20 to 30 atmospheres of hydrogen or deuterium. The anneal process employed to outdiffuse the hydrogen isotope(s) from the dielectric cores 62 into the polycrystalline channel portions 60 can be performed at a temperature that is below the temperature range that induces crystallization of the material of the polycrystalline channel portions 60 (which is above 600 degrees Celsius).

After the anneal process, each dielectric core 62 comprises a dielectric material having an average atomic concentration for hydrogen isotopes including hydrogen atoms and/or deuterium atoms greater than $5.0 \times 10^{17}/cm^3$, such as a range from $1.0 \times 10^{18}/cm^3$ to $5.0 \times 10^{21}/cm^3$. In one embodiment, the hydrogen isotopes in the dielectric cores 62 can be predominantly hydrogen atoms (i.e., more than one half are hydrogen atoms). For example, more than 99% of all hydrogen isotopes in the dielectric cores 62 may be hydrogen atoms. Alternatively, the hydrogen isotopes in the dielectric cores 62 can be predominantly deuterium atoms (i.e., more than one half are deuterium atoms). For example, more than 99% of all hydrogen isotopes in the dielectric cores 62 may be deuterium atoms.

The duration and/or the temperature of the anneal process can be selected to prevent outdiffusion of hydrogen isotopes from polycrystalline channel portions 60. By limiting the duration and/or the temperature of the anneal process, the hydrogen isotopes have a greater average atomic concentration within the dielectric cores 62 than within the polycrystalline channel portions 60 after the anneal process. In one embodiment, the average atomic concentration of the hydrogen isotopes within each polycrystalline channel portion 60 can be greater than $1 \times 10^{17}/cm^3$, such as a range from $5 \times 10^{17}/cm^3$ to $1.25 \times 10^{20}/cm^3$, including $1 \times 10^{19}/cm^3$ to $1 \times 10^{20}/cm^3$ after the anneal process.

Figure 23:
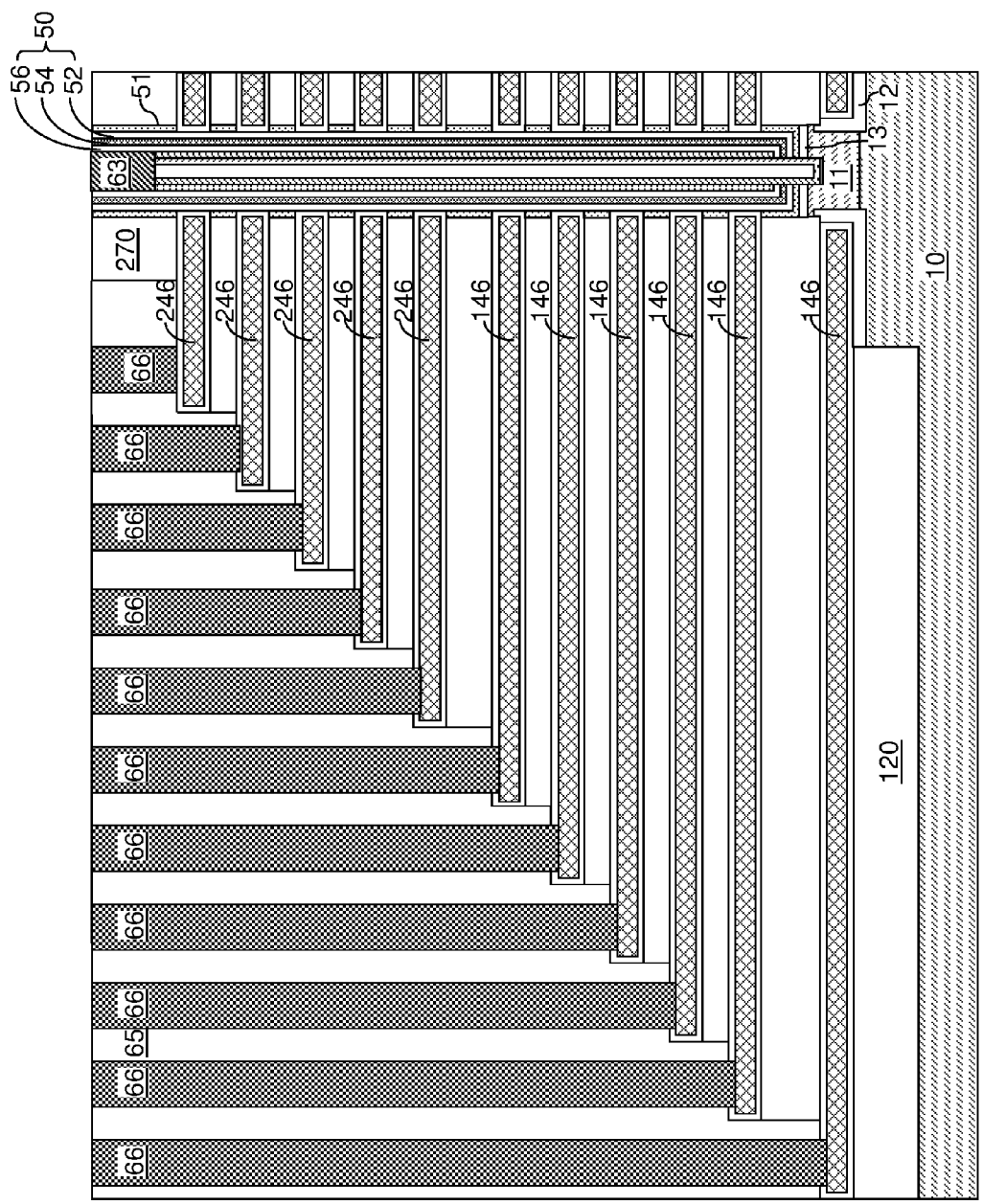
FIG. 23 is another vertical cross-sectional view of the exemplary structure of FIG. 22 along line X-X' in a contact region according to an embodiment of the present disclosure.

Referring to FIG. 23, a contact region of the exemplary structure is illustrated. The vertical plane X-X' illustrated in FIG. 22 can be the plane of the vertical cross-sectional view of FIG. 23. FIG. 23 illustrates a stepped region, i.e., a region including stepped surfaces are present. At least one retro-stepped dielectric material portion 65 can overlie the stepped surfaces. Each underlying electrically conductive layer (146, 246) among the first and second electrically conductive layers (146, 246) extends farther away from the memory stack structure than any overlying electrically conductive layer (146, 246) among the first and second electrically conductive layers (146, 246). At least one retro-stepped dielectric material portion 65 including a dielectric material can be provided over the stepped surfaces.

Contact via structures 66 contacting a respective electrically conductive layer (146, 246) can be formed, for example, by deposition of at least one conductive material in via cavities, and removal of each portion of the at least one conductive material from above the horizontal plane including the top surface of the second dielectric cap layer 270. Additional contact via structures (not shown) can be formed through the second dielectric cap layer 270 and addition dielectric material portions as necessary.

The exemplary structure can include a monolithic three-dimensional memory device that comprises at least one tier structure (132, 246, 232, 246) located over a top surface of a substrate 10. Each of the at least one tier structure comprising an alternating stack including insulating layers (132 or 232) and electrically conductive layers (146 or 246). A memory opening extends through an entirety of the at least one tier structure (132, 246, 232, 246). A memory stack structure (50, 60) is located within the memory opening, and comprises a plurality of charge storage regions (as embodied as portions of the memory material layer 54 located at levels of the electrically conductive layers (146, 246)). The monolithic three-dimensional memory device further includes a first active region 61 located in the substrate 10, a second active region 63 located in an upper portion of the memory opening, a semiconductor channel (which includes the polycrystalline channel portion 60, the epitaxial channel portion 11, and a surface portion of the substrate semiconductor layer 10 that underlies the gate dielectric layer 12) extending from the first active region 61, through the memory opening, and to the second active region 63.

The monolithic three-dimensional memory device can further include a backside contact via structure (76A, 76B) extending through the at least one tier structure (132, 246, 232, 246). A top surface of the backside contact via structure (76A, 76B) and a top surface of the second active region 63 can be within a same horizontal plane that is parallel to the top surface of the substrate 10.

In one embodiment, the monolithic three-dimensional memory device can further comprise a dielectric core 62 containing hydrogen isotopes (including hydrogen atoms and/or deuterium atoms). The hydrogen isotopes have a greater average atomic concentration within the dielectric core than within a polycrystalline channel portion 60 of the semiconductor channel. In one embodiment, the average atomic concentration of the hydrogen isotopes within the dielectric core 62 is greater than $5 \times 10^{17}/cm^3$, and the average atomic concentration of the hydrogen isotopes within the polycrystalline channel portion 60 is greater than $1 \times 10^{17}/cm^3$. In one embodiment, the dielectric core 62 comprises a dielectric material selected from silicon nitride and silicon oxide.

In one embodiment, each of the electrically conductive layers (146, 246) is vertically spaced from the insulating layers (132, 232) at least by a horizontal portion of a backside blocking dielectric 501, and is laterally spaced from the memory stack structure (50, 60) by a respective vertical portion of the backside blocking dielectric 501. In one embodiment, the monolithic three-dimensional memory device further comprises annular dielectric spacers 51 located at each level of the insulating layers (132, 232) and laterally surrounding the memory stack structure (50, 60). Inner sidewalls of the backside blocking dielectric 501 and inner sidewalls of the annular dielectric oxide spacers 51 are vertically coincident. As used herein, two surfaces are "vertically coincident" if the two surfaces overlie or underlie each other and if there exists a vertical plane that includes the two surfaces. In one embodiment, the memory stack structure (50, 60) comprises a blocking dielectric 52, and each of the annular dielectric oxide spacers 51 contacts a respective portion of an outer sidewall of the blocking dielectric 52.

In one embodiment, the monolithic three-dimensional memory device can further comprise an epitaxial channel portion 11 underlying the memory stack structure (50, 60) and contacting a semiconductor material layer (i.e., the substrate semiconductor layer 10) in the substrate; a first active region 61 having a doped semiconductor material and embedded within the semiconductor material layer; and a source contact via structure (76A, 76B) that is electrically isolated from the first and second electrically conductive layers (146, 246) and contacting the first active region 61. The monolithic three-dimensional memory device can further comprise a gate dielectric layer 12 contacting a sidewall of the epitaxial channel portion 11 and a top surface of the semiconductor material layer 10; and a source select gate electrode (i.e., the bottommost first electrically conductive layer 146) overlying the gate dielectric layer 12. In one embodiment, the gate dielectric layer 12 can comprises silicon oxide, and the backside blocking dielectric 501 can be located between the gate dielectric layer 12 and the source select gate electrode.

In one embodiment, the monolithic three-dimensional memory device can further comprise a stepped region in which each underlying electrically conductive layer among the first and second electrically conductive layers (146, 246) extends farther away from the memory stack structure (50, 60) than any overlying electrically conductive layer among the first and second electrically conductive layers (146, 246), and contact via structures 66 contacting a respective electrically conductive layer among the first and second electrically conductive layers (146, 246). The memory stack structure (50, 60) can comprise, from inside to outside: a polycrystalline channel portion 60, a tunneling dielectric layer 56 laterally surrounding the polycrystalline channel portion 60, and charge storage regions (as embodied as portions of the memory material layer 54) laterally surrounding the tunneling dielectric layer 56.

In one embodiment, the at least one tier structure (132, 146, 232, 246) can comprise a plurality of tier structures, the memory opening 49 can comprise a laterally protruding tapered portion 49A located between a pair of tier structures within the plurality of tier structures (132, 146, 232, 246), as shown in FIG. 8.

In one embodiment, the monolithic three-dimensional memory structure comprises a monolithic three-dimensional NAND memory device. The first and second electrically conductive layers can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

In some embodiments of the present disclosure, the memory openings can be filled with a sacrificial memory opening structure including a sacrificial fill material such as silicon nitride. After formation of the backside trenches and replacement of the sacrificial material layers with electrically conductive layers, the sacrificial memory opening fill structures are replaced with memory stack structures and dielectric cores. Under this process flow where the memory stack structure which includes the channel is formed after replacement of the sacrificial layers with the control gate electrodes, the control gate electrodes (as embodied as the electrically conductive layers that replace the sacrificial material layers) have no, or minimal, corner rounding. This is because there is no need to oxidize the silicon nitride of the sacrificial material layers (which is employed as an etch stop material during formation of the backside recesses), and therefore, no oxidation process is performed on the sidewalls of the silicon nitride layers after formation of the memory openings. Further, there will not be any ONON shrinkage before the backside trench etch because the memory stack structures are formed after formation of the backside trenches. This prevents or reduces a tungsten deficit if tungsten is employed as the material of the electrically conductive layers. Blocking dielectric can be deposited in the memory openings after formation of the electrically conductive layers. This process flow is also compatible with formation of air gaps between electrically conductive layers.

In addition, the thermal budget after formation of the dielectric cores 62 can be maintained low enough to ensure that the hydrogen isotopes that are present in the polycrystalline channel portions 60 can remain at a high level, thereby providing sufficient passivation of surface states to enhance the electrical conductivity of the polycrystalline channel portions 60. The deposition process for the second active regions 63 can be employed as the anneal process that diffuses the hydrogen isotopes into the polycrystalline channel portions 60 or a separate anneal may be used. There is no high thermal budget process impact on the concentration of the hydrogen isotopes because the processes temperature after formation of the second active regions 63 can be maintained below a temperature range that induces significant outdiffusion of the hydrogen isotopes from the channel. Thus, all process steps that follow the deposition of the dielectric core region 62 and outdiffusion of the hydrogen isotopes from the core 62 into the channel 60 are conducted at a relatively low temperature, e.g., below 500 degrees Celsius, to prevent or reduce the outdiffusion of the isotopes from the channel. Thus, the semiconductor channel is not exposed to a temperature above 500 degrees Celsius after the step of outdiffusing until completion of the device. Completion of the device comprises the last step in the manufacturing process before the device can be operated to store charge (i.e., to store data).

The hydrogen isotope channel doping also decreases the intrinsic threshold voltage width of the NAND device. For example, if intrinsic threshold voltage is plotted versus bit count for a NAND device, then hydrogen isotope channel doping decreases the intrinsic threshold voltage peak width by at least 1.2 V, such as by 1.4 to 1.7 V compared to the same device in which the channel is not intentionally doped with the hydrogen isotope. For example, the intrinsic threshold voltage width (at 12 standard deviations from the mean bit threshold voltage) may be less than 4.5V, such as 3.3 to 3.4V, for example 3.3 to 3.5V.

Furthermore, the hydrogen isotope channel doping decreases the intrinsic threshold voltage by at least 0.5 V, such as by 0.6 to 0.8 V compared to the same device in which the channel is not intentionally doped with the hydrogen isotope. Thus, outdiffusing the hydrogen isotopes into the channel to dope the channel with the hydrogen isotopes results in an improved subthreshold slope, higher cell current and narrower threshold voltage width of the device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
   at least one tier structure located over a top surface of a substrate, the at least one tier structure comprising an alternating stack including insulating layers and electrically conductive layers;
   a memory opening extending through an entirety of the at least one tier structure;
   a memory stack structure located within the memory opening and comprising a plurality of charge storage regions and a vertical portion of a semiconductor channel;
   a first active region located in the substrate;
   a second active region located in an upper portion of the memory opening; and
   a backside contact via structure extending through the at least one tier structure, wherein a top surface of the backside contact via structure and a top surface of the second active region are within a same horizontal plane that is parallel to the top surface of the substrate,
   wherein the monolithic three-dimensional memory device comprises at least one feature selected from:
   a first feature that the monolithic three-dimensional memory device further comprises a dielectric core containing hydrogen isotopes, wherein the hydrogen isotopes have a greater average atomic concentration within the dielectric core than within the vertical portion of the semiconductor channel;
   a second feature that each of the electrically conductive layers is vertically spaced from the insulating layers at least by a horizontal portion of a backside blocking dielectric, and is laterally spaced from the memory stack structure by a respective vertical portion of the backside blocking dielectric;
   a third feature that the monolithic three-dimensional memory device further comprises:
      an epitaxial semiconductor channel portion underlying the memory stack structure and contacting a semiconductor material layer in the substrate,
      a source contact via structure that is electrically isolated from the electrically conductive layers and contacting the first active region,
      a gate dielectric layer contacting a sidewall of the epitaxial semiconductor channel portion and a top surface of the semiconductor material layer, and
      a source select gate electrode overlying the gate dielectric layer, wherein:
         the gate dielectric layer comprises silicon oxide, and
         a backside blocking dielectric is located between the gate dielectric layer and the source select gate electrode; or
   a fourth feature that the at least one tier structure comprises a plurality of tier structures, and the memory opening comprises a laterally protruding tapered portion located between a pair of tier structures within the plurality of tier structures.

2. The monolithic three-dimensional memory device of claim 1, wherein the monolithic three-dimensional memory device comprise at least the first feature.

3. The monolithic three-dimensional memory device of claim 2, wherein:
   the average atomic concentration of the hydrogen isotopes within the dielectric core is greater than $5\times10^{17}/cm^3$; and
   the average atomic concentration of the hydrogen isotopes within the vertical portion of the semiconductor channel is greater than $1\times10^{17}/cm^3$.

4. The monolithic three-dimensional memory device of claim 1, wherein the monolithic three-dimensional memory device comprise at least the second feature.

5. The monolithic three-dimensional memory device of claim 4, further comprising annular dielectric oxide spacers located at each level of the insulating layers and laterally surrounding the memory stack structure, wherein inner sidewalls of the backside blocking dielectric and inner sidewalls of the annular dielectric oxide spacers are vertically coincident.

6. The monolithic three-dimensional memory device of claim 5, wherein:
   the memory stack structure comprises a blocking dielectric; and
   each of the annular dielectric oxide spacers contacts a respective portion of an outer sidewall of the blocking dielectric.

7. The monolithic three-dimensional memory device of claim 1, wherein the monolithic three-dimensional memory device comprise at least the third feature.

8. The monolithic three-dimensional memory device of 1, further comprising:
   a stepped region in which each underlying electrically conductive layer among the electrically conductive layers extends farther away from the memory stack structure than any overlying electrically conductive layer among the electrically conductive layers; and
   contact via structures contacting a respective electrically conductive layer among the electrically conductive layers,
   wherein the memory stack structure comprises, from inside to outside:
      a polycrystalline channel portion embodied as the vertical portion of the semiconductor channel,
      a tunneling dielectric layer laterally surrounding the polycrystalline channel portion, and
      charge storage regions laterally surrounding the tunneling dielectric layer.

9. The monolithic three-dimensional memory device of claim 1, wherein the monolithic three-dimensional memory device comprise at least the fourth feature.

10. The monolithic three-dimensional memory device of claim 1, wherein:
    the monolithic three-dimensional memory structure comprises a monolithic three-dimensional NAND memory device;
    the electrically conductive layers comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon; and
    the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

11. A monolithic three-dimensional memory device comprising:

at least one tier structure located over a top surface of a substrate, the at least one tier structure comprising an alternating stack including insulating layers and electrically conductive layers;

a memory opening extending through an entirety of the at least one tier structure;

a memory stack structure located within the memory opening and comprising a plurality of charge storage regions and a vertical portion of a semiconductor channel containing an atomic concentration of hydrogen isotopes of at least $1 \times 10^{17}/cm^3$;

a first active region located in the substrate;

a second active region located in an upper portion of the memory opening; and a dielectric core formed in the memory stack structure and containing hydrogen isotopes.

12. The monolithic three-dimensional memory device of claim 11, wherein:

the hydrogen isotopes have a greater average atomic concentration within the dielectric core than within the vertical portion of the semiconductor channel in the memory opening;

an average atomic concentration of the hydrogen isotopes within the vertical portion of the semiconductor channel is in a range from $1 \times 10^{19}/cm^3$ to $1 \times 10^{20}/cm^3$; and an average atomic concentration of the hydrogen isotopes within the dielectric core is in a range from $1 \times 10^{18}/cm^3$ to $5 \times 10^{21}/cm^3$.

13. The monolithic three-dimensional memory device of claim 11, wherein the dielectric core comprises a dielectric material selected from silicon nitride and silicon oxide.

14. The monolithic three-dimensional memory device of claim 11, further comprising a backside contact via structure extending through the at least one tier structure, wherein a top surface of the backside contact via structure and a top surface of the second active region are within a same horizontal plane that is parallel to the top surface of the substrate.

15. The monolithic three-dimensional memory device of claim 11, wherein the hydrogen isotopes comprise hydrogen.

16. The monolithic three-dimensional memory device of claim 11, wherein the hydrogen isotopes comprise deuterium.

17. The monolithic three-dimensional memory device of claim 11, wherein the hydrogen isotopes result in an improved subthreshold slope, higher cell current and narrower threshold voltage width of the device compared to a same device in which the semiconductor channel is not intentionally doped with the hydrogen isotopes.

18. The monolithic three-dimensional memory device of claim 11, wherein:

the at least one tier structure comprises a plurality of tier structures; and the memory opening comprises a laterally protruding tapered portion located between a pair of tier structures within the plurality of tier structures.

19. The monolithic three-dimensional memory device of claim 11, wherein:

the monolithic three-dimensional memory structure comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

20. A method of forming the three-dimensional memory device of claim 11, comprising:

forming a lower tier structure over the substrate, the lower structure comprising an alternating stack of insulating layers and sacrificial material layers;

forming a first memory opening extending through the lower tier structure;

forming an upper tier structure over the lower tier structure, the upper tier structure comprising an alternating stack of insulating layers and sacrificial material layers;

forming a second memory opening through the upper tier structure in an area overlying the first memory opening;

forming a sacrificial memory opening fill structure within the first and the second memory openings that collectively comprise the memory opening;

replacing the sacrificial material layers of the upper and lower tier structure with electrically conductive layers, to form the at least one tier structure comprising the alternating stack including the insulating layers and the electrically conductive layers;

replacing, after formation of the electrically conductive layers, the sacrificial memory opening fill structure with the memory stack structure that includes the plurality of charge storage regions located at levels of the electrically conductive layers and the vertical portion of the semiconductor channel;

forming the first active region in the substrate;

forming the dielectric core of in the memory stack structure; and forming the second active region in the upper portion of the memory opening.

21. The method of claim 20, wherein the sacrificial memory opening fill structure and the sacrificial material layers comprise a same dielectric material.

22. The method of claim 20, wherein the dielectric core comprises a dielectric material having an average atomic concentration of hydrogen isotopes greater than $5\times10^{17}/cm^3$; and the method further comprises outdiffusing the hydrogen isotopes from the dielectric core into the vertical portion of the semiconductor channel.

23. The method of claim 20, further comprising forming a laterally protruding tapered portion between the first and the second memory opening.

24. The method of claim 20, further comprising:

forming a temporary material portion in the first memory opening prior to forming the upper tier structure;

exposing the temporary material portion at a bottom of the second memory opening during the step of forming the second memory; and removing the temporary material portion through the second memory opening prior to forming the memory opening fill structure within the first and the second memory openings.

25. The method of claim 24, further comprising:

forming an epitaxial channel portion at a bottom portion of the first memory opening, wherein the temporary material portion is formed over the epitaxial channel portion;

forming a semiconductor oxide portion by oxidizing a surface portion of the epitaxial channel portion, wherein the temporary material portion is formed directly on the semiconductor oxide portion, and the temporary material portion comprises a semiconductor material;

converting exposed side surface portions of the epitaxial channel portion to a gate dielectric material layer; and forming a source select gate electrode over the gate dielectric layer.

26. The method of claim 20, further comprising forming a backside contact via structure through the upper and lower tier structures in contact with first active region, wherein a top surface of the backside contact via structure is formed within a horizontal plane that includes a top surface of the sacrificial memory opening fill structure.

27. The method of claim 26, further comprising forming a dielectric cap layer over the upper tier structure, wherein:

a top surface of the backside contact via structure is formed by planarizing a conductive material employing a top surface of the dielectric cap layer as a stopping surface for a planarization process; and the second active region is formed by depositing a doped semiconductor material in an upper portion of the memory opening and planarizing the deposited doped semiconductor material employing the top surface of the dielectric cap layer as a stopping surface for another planarization process.

28. The method of claim 20, further comprising:

depositing a dielectric oxide layer on a sidewall of the upper and lower memory openings prior to forming the memory opening fill structure;

forming lateral recesses by removing the sacrificial material layers employing an etch process that removes the sacrificial material layers selective to the insulating layers and to the dielectric oxide layer; and removing physically exposed portions of the dielectric oxide layer after formation of the lateral recesses, wherein remaining portions of the dielectric oxide layer located at levels of the insulating layers constitute annular dielectric oxide spacers vertically spaced from one another, and contacting an outer sidewall of the memory opening fill structure.

29. The method of claim 28, wherein portions of an outer surface of the sacrificial memory opening fill structure are physically exposed after removal of the physically exposed portions of the dielectric oxide layer, and the method further comprises depositing a backside blocking dielectric on physically exposed portions of the outer surface of the sacrificial memory opening fill structure.

30. The method of claim 20, wherein:

the three-dimensional memory structure comprises a monolithic three-dimensional NAND memory device;

the conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

31. A method of forming the three-dimensional memory device of claim 11 comprising:

forming at least one tier structure over a substrate, the at least one tier structure comprising an alternating stack of the insulating layers and sacrificial material layers;

forming the memory opening extending through an entirety of the alternating stack of the insulating layers and the sacrificial material layers;

replacing the sacrificial material layers of the at least one tier structure with electrically conductive layers to form the at least one tier structure comprising the alternating stack including the insulating layers and the electrically conductive layers;

forming the memory stack structure that includes the plurality of charge storage regions located at levels of the electrically conductive layers and the vertical portion of the semiconductor channel;

forming the dielectric core within the memory stack structure inside the memory opening, wherein the dielectric core comprises a dielectric material having an average atomic concentration of hydrogen isotopes greater than $5\times10^{17}/cm^3$;

forming the first active region in the substrate;

forming the second active region in the upper portion of the memory opening; and outdiffusing the hydrogen isotopes from the dielectric core into the vertical portion of the semiconductor channel.

32. The method of claim 31, wherein:

outdiffusing the hydrogen isotopes comprises annealing the dielectric core at a temperature in a range from 375 degrees Celsius to 500 degrees Celsius; and the semiconductor channel is not exposed to a temperature above 500 degrees Celsius after the step of outdiffusing until completion of the device.

33. The method of claim 31, wherein the dielectric core comprises a dielectric material selected from silicon nitride and silicon oxide and wherein the hydrogen isotopes comprise hydrogen.

34. The method of claim 31, wherein the dielectric core comprises a dielectric material selected from silicon nitride and silicon oxide and wherein the hydrogen isotopes comprise deuterium.

35. The method of claim 31, wherein after the step of outdiffusing an average atomic concentration of the hydrogen isotopes within the vertical portion of the semiconductor channel is in a range from $1\times10^{19}/cm^3$ to $1\times10^{20}/cm^3$, and an average atomic concentration of the hydrogen isotopes within the dielectric core is in a range from $1\times10^{18}/cm^3$ to $5\times10^{21}/cm^3$.

36. The method of claim 31, wherein the step of outdiffusing the hydrogen isotopes results in an improved subthreshold slope, higher cell current and narrower threshold voltage width of the device compared to a same device in which the semiconductor channel is not intentionally doped with the hydrogen isotopes.

* * * * *